United States Patent
Miki et al.

(10) Patent No.: US 6,805,494 B2
(45) Date of Patent: Oct. 19, 2004

(54) OPTICAL MODULE AND OPTICAL DEVICE

(75) Inventors: Atsushi Miki, Yokohama (JP); Hiroyuki Yabe, Yokohama (JP); Kazuhiro Tanida, Yokahama (JP); Yoko Watanabe, Yokohama (JP); Jiro Shinkai, Yokohama (JP); Toshio Takagi, Yokohama (JP); Goro Sasaki, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 139 days.

(21) Appl. No.: 10/295,034

(22) Filed: Nov. 15, 2002

(65) Prior Publication Data

US 2003/0112500 A1 Jun. 19, 2003

(30) Foreign Application Priority Data

Nov. 15, 2001 (JP) .................... P2001-350674
Nov. 8, 2002 (JP) .................... P2002-325657

(51) Int. Cl.[7] .............................. G02B 6/36
(52) U.S. Cl. ..................... 385/88; 385/93; 372/32
(58) Field of Search .................. 385/88–94; 372/32, 372/34

(56) References Cited

U.S. PATENT DOCUMENTS 5,412,748 A * 5/1995 Furuyama et al. ............ 385/92

6,739,764 B2 * 5/2004 Ido et al. .................... 385/92

OTHER PUBLICATIONS

"50 GHz spacing, multi-wavelength tunable locker integrated in a transmitter module with a monolithic-modulator and a DBF-laser", K. Tatsuno et al., 2001 OFC, Mar. 17,–Mar. 22, 2002, pp. TuB5–1–TuB5–4.

* cited by examiner

Primary Examiner—Phan T. H. Palmer
(74) Attorney, Agent, or Firm—McDermott Will & Emery LLP

(57) ABSTRACT

A main portion 10 of an optical module 1 includes a thermoelectric cooler 21, and a chip carrier 22b placed on the cooler 21. A semiconductor light-emitting device 31, a lens 32, photodetectors 33a, 33b, and an etalon 34 are directly or indirectly mounted on the chip carrier 22b. Supporting members 36a and 36b are also fixed on the chip carrier 22b. A roof 35 is supported by the supporting members 36a, 36b and positioned above the etalon 34. The roof 35, supporting members 36a, 36b and chip carrier 22b are maintained at substantially equal temperatures by the cooler 21. As a result, the temperature of the etalon 34 is stabilized, and therefore the variation in the lock wavelength is suppressed.

28 Claims, 24 Drawing Sheets

OPTICAL MODULE AND OPTICAL DEVICE

BACKGROUND OF THE INVENTION

1. Field of the Invention

The present invention relates to an optical module used in an optical communications system.

2. Related Background Art

An optical module is used in a wavelength division multiplexing (WDM) transmission system using a plurality of wavelength components. In a 1.55 μm band WDM system, the wavelength interval of the adjacent grids is set at approximately 0.8 nm (100 GHz), for example. In order to realize this wavelength interval, the wavelength of light emitted from the optical module must be controlled to a range of the grid wavelength plus/minus 0.03 nm.

The many of optical modules currently in use are provided with a semiconductor laser element, a photodetector, and a temperature adjuster. The wavelength of the laser light slightly emitted from a light-reflecting surface of the laser element is monitored by the photodetector, and the temperature of the laser element is adjusted based on the monitoring result to control the wavelength of the laser light. In order to detect variation of the wavelength precisely, an etalon is provided between the laser element and the photodetector. The etalon has wavelength-dependent optical transmittance. That is, the optical transmittance of the etalon is dependent on the wavelength of light incident on the etalon. Therefore, the intensity of the laser light monitored by the photodetector has a value in accordance with the wavelength thereof.

In an optical module using an etalon, the wavelength of the light emitted from the optical module is controlled in the following manner. FIGS. 1A and 1B are diagrammatic views showing relationships between the wavelength of the laser light from the laser element and the output current of the photodetector. As shown in FIG. 1A, the waveform F of the output current of the photodetector changes periodically in accordance with increases in the wavelength λ. Here, the grid wavelength used in a WDM system is set as $\lambda_0$. The current value of the output current from the photodetector when light with wavelength $\lambda_0$ enters the photodetector is set at $I_0$. By adjusting the temperature of the laser element so that the output current becomes the value $I_0$, the wavelength of the laser light is locked at the grid wavelength $\lambda_0$.

The temperature of the etalon may change due to changes in usage environment and the like when the optical module is in operation. If the etalon temperature rises from $T_0$ to $T_1$, for example, the waveform F of the output current shifts to waveform G on the long wavelength side, as shown in FIG. 1B. This is due to thermal expansion of the etalon caused by increase in the temperature of the etalon or due to change in the refractive index of the material composing the etalon. As a result of such a wavelength shift, the lock wavelength to be locked at the grid wavelength $\lambda_0$ shifts to $\lambda_1$. When the etalon is composed of general-use, common optical glass, then the amount of the lock wavelength shift $\Delta \lambda = \lambda_1 - \lambda_0$ has a temperature dependence of approximately 0.013 nm/° C. In order to prevent variation in the lock wavelength caused by the temperature change in the etalon, the etalon is maintained at a temperature such as 25° C., by a temperature adjuster disposed inside the optical module packaging.

SUMMARY OF THE INVENTION

The inventors have devoted themselves to research in order to enhance the wavelength controllability of an optical module, as a result of which the following findings have been obtained. The temperature of optical module packaging may rise to approximately 80° C. depending on the environment in which the optical module is used. In such a case, a temperature difference of approximately 55° C. occurs between the packaging and the temperature adjuster. It is proved according to the result of the research performed by the inventors that when such a temperature difference exists inside an optical module, thermal convection or thermal radiation occurs, making it difficult to maintain the temperature of the etalon at a constant level.

In light of the present situation in which the amount of information transmitted and received in optical communications systems is rapidly increasing, it is desirable to further narrow the grid wavelength interval. In order to achieve such a narrowing, the wavelength of light transmitted from an optical module must be controlled more precisely. It is therefore desirable to further suppress the variation in the lock wavelength associated with temperature change in an optical element such as an etalon.

An object of the present invention is to provide an optical module capable of suppressing lock wavelength shift caused by temperature change in an optical element.

One aspect of the present invention provides an optical module comprising: a semiconductor light-emitting device for emitting light; an optical element with wavelength-dependent optical transmittance; a photodetector which is disposed to receive light transmitted through the optical element; a temperature adjuster for heating and/or cooling the optical element; and a roof which is disposed above the optical element and thermally coupled to the temperature adjuster. The optical element has a light-receiving surface and a light-emitting surface, and is disposed to receive light from the semiconductor light-emitting device on the light-receiving surface. The temperature adjuster is disposed below the optical element.

Light emitted from the semiconductor light-emitting device passes through the optical element to enter the photodetector. The photodetector outputs an electrical signal according to the intensity of the incident light. The transmittance of the optical element is dependent on the wavelength of incident light, and therefore the light transmitted through the optical element has an intensity corresponding to its wavelength. Thus the output signal of the photodetector indicates the wavelength of the light emitted from the optical element. Accordingly, monitoring the output signal from the photodetector makes it possible to regulate the wavelength of the light emitted from the optical element to a desired lock wavelength based on the result of the monitoring. The roof is thermally coupled to the temperature adjuster and is therefore maintained at a temperature substantially equal to that of the temperature adjuster. Therefore, the temperature of the optical element, which is positioned between the roof and the temperature adjuster, is also maintained at a temperature substantially equal to those of the roof and the temperature adjuster. As a result, thermal expansion, heat shrinkage and refractive index change in the optical element are suppressed, and therefore variation in the lock wavelength is suppressed.

Another aspect of the present invention provides an optical device comprising: an optical element with wavelength-dependent optical transmittance, having a light-receiving surface and a light-emitting surface; and a holder for accommodating the optical element so that the light-receiving surface and light-emitting surface are exposed. If the optical device is installed inside the optical module so that the holder is thermally coupled to the temperature adjuster, the holder can be maintained at a temperature substantially equal to that of the temperature adjuster. Thus the temperature of the optical element accommodated in the holder is also maintained at a temperature substantially equal to those of the holder and the temperature adjuster. Since the temperature of the optical element is stabilized, variation in the lock wavelength of the optical module is suppressed.

A further aspect of the present invention provides an optical module comprising: a semiconductor light-emitting device for emitting light; an optical element with wavelength-dependent optical reflectance; a photodetector which is disposed to receive light reflected by the optical element; a temperature adjuster for heating and/or cooling the optical element; and a roof disposed above the optical element and thermally coupled to the temperature adjuster. The optical element has a light-receiving surface and is disposed to receive light from the semiconductor light-emitting device on the light-receiving surface. The temperature adjuster is disposed below the optical element.

Light emitted from the semiconductor light-emitting device is reflected by the optical element to enter the photodetector. The reflectance of the optical element is dependent on the wavelength of incident light, and therefore the light reflected by the optical element has an intensity corresponding to its wavelength. Thus the output signal from the photodetector indicates the wavelength of the light emitted from the light-emitting device. Accordingly, monitoring the output signal from the photodetector makes it possible to regulate the wavelength of the light emitted from the optical element to a desired lock wavelength based on the result of the monitoring. The roof is thermally coupled to the temperature adjuster, and therefore the roof is maintained at a temperature substantially equal to that of the temperature adjuster. Thus the temperature of the optical element, which is positioned between the roof and the temperature adjuster, is also maintained at a temperature substantially equal to those of the roof and the temperature adjuster. As a result, variation in the lock wavelength is suppressed.

A further aspect of the present invention provides an optical device comprising: an optical element with wavelength-dependent optical reflectance, having a light-receiving surface; and a holder for accommodating the optical element so that the light-receiving surface is exposed. If the optical device is installed inside the optical module so that the holder is thermally coupled to the temperature adjuster, the holder can be maintained at a temperature substantially equal to that of the temperature adjuster. Thus the temperature of the optical element accommodated in the holder is also maintained at a temperature substantially equal to those of the holder and the temperature adjuster. Since the temperature of the optical element is stabilized, variation in the lock wavelength of the optical module is suppressed.

The roof and the holder are preferably composed of a material with higher thermal conductivity than that of the optical element. In this case, the temperatures of the roof and holder exhibit good responses to the temperature change in the temperature adjuster. As a result, the lock wavelength can be even further stabilized.

The present invention will become more fully understood from the detailed description given hereinbelow and the accompanying drawings which are given by way of illustration only, and thus are not to be considered as limiting the present invention.

DETAILED DESCRIPTION OF THE PREFERRED EMBODIMENTS

Figure 1A:
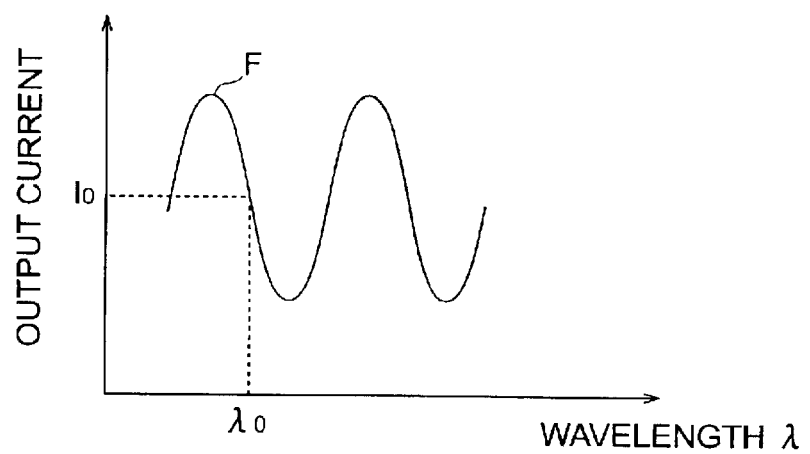
FIGS. 1A and 1B illustrate the relationships between the wavelength of laser light from a semiconductor laser element and the output current of a photodetector.
Figure 1B:
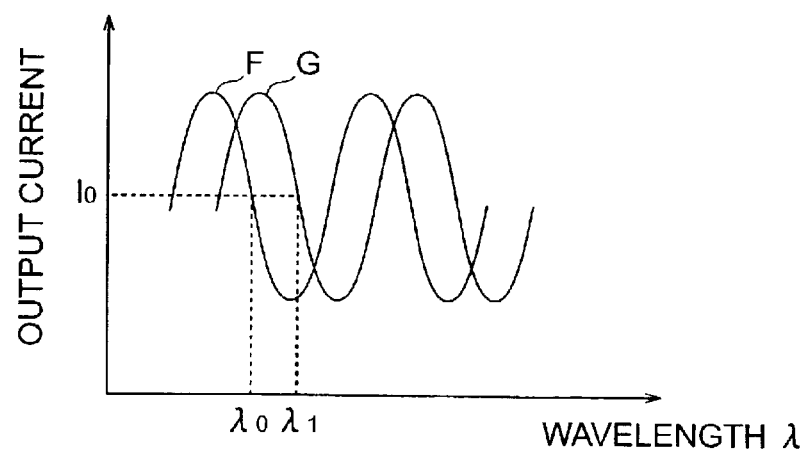

The preferred embodiments of the present invention will be described below in greater detail with reference to the accompanying drawings. To facilitate understanding, identical reference numerals have been used, where possible, to designate identical or equivalent elements that are common to the figures without repeating the overlapping descriptions.

First Embodiment

Figure 2:
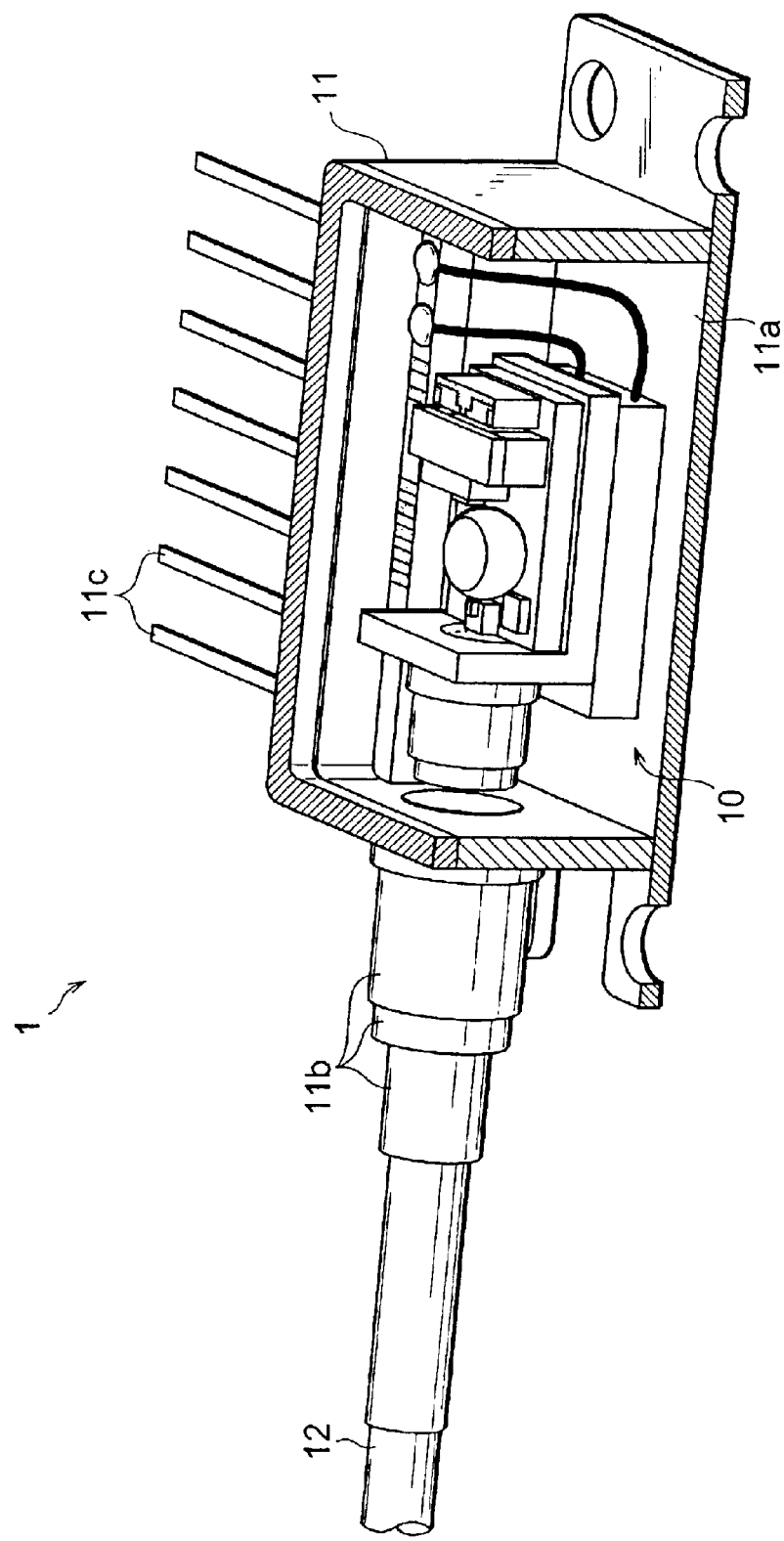
FIG. 2 is a partially cut-away perspective view of an optical module of a first embodiment.

A first embodiment of the optical module in accordance with the present invention will now be described. FIG. 2 is a partially cut-away perspective view of an optical module 1 of the first embodiment. The optical module 1 comprises a main portion 10 and housing 11. The housing 11 comprises a main body 11a for containing the main portion 10, a tubular portion 11b for guiding an optical fiber 12 into the main portion 10, and a plurality of lead pins 11c.

Figure 3A:
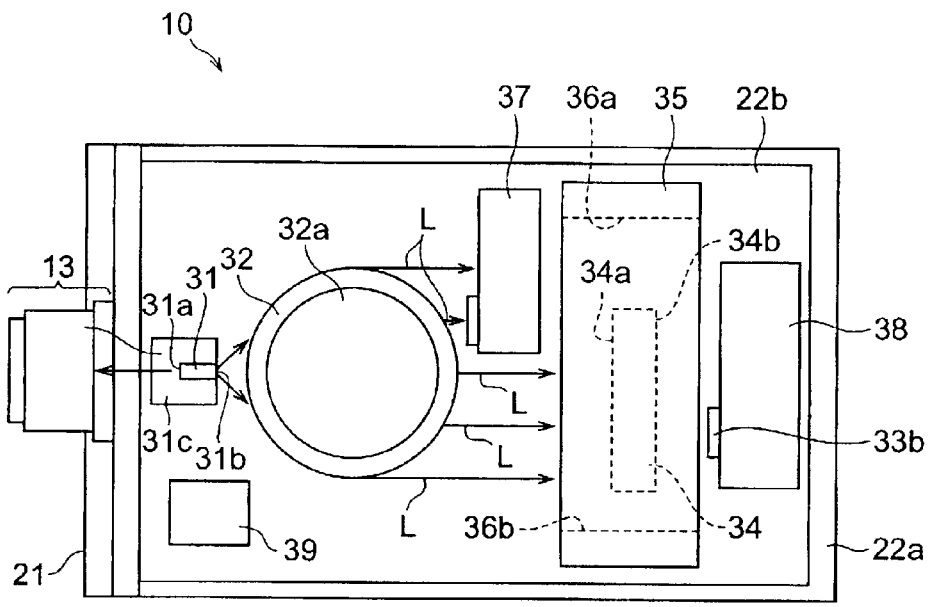
FIG. 3A is a plan view showing the main portion of an optical element.
Figure 3B:
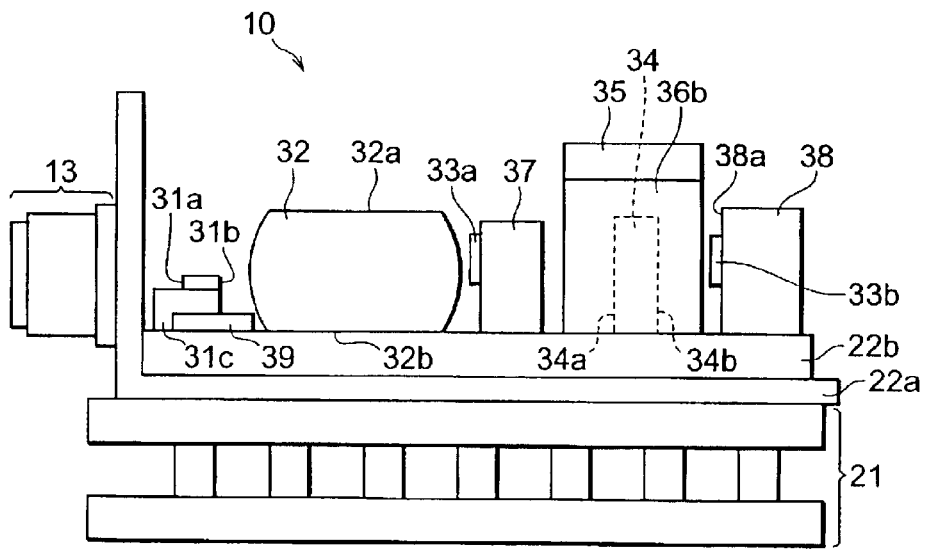
FIG. 3B is a side view showing the main portion.

Referring to FIGS. 3A and 3B, the main portion 10 will now be described in detail. FIG. 3A is a plan view showing the main portion 10 and FIG. 3B is a side view showing the main portion 10. The main portion 10 includes a thermoelectric cooler 21 as a temperature adjuster, an L-shaped carrier 22a placed on top of the thermoelectric cooler 21, and a chip carrier 22b placed on top of the L-carrier 22a.

The thermoelectric cooler 21 regulates the temperature of the chip carrier 22b installed on the cooler 21 via the L-carrier 22a. The L-carrier 22a and the chip carrier 22b are thermally coupled to the cooler 21. A semiconductor light-emitting device 31, a lens 32, photodetectors 33a and 33b, and an etalon 34 are directly or indirectly mounted on the chip carrier 22b. The L-carrier 22a and the chip carrier 22b are preferably composed of a good thermal conductor such as silicon (Si), aluminum nitride (AlN), alumina ($Al_2O_3$), or Kovar (TM). When the chip carrier 22b is composed of Si, the chip carrier 22b is specifically called a Si bench. The temperature of the chip carrier 22b is monitored by a thermistor 39. A temperature controlling element which utilizes the peltier effect, that is, a peltier element, may be used as the thermoelectric cooler 21, for example. Using the peltier element enables the temperatures of the light-emitting device 31 and the etalon 34 to be regulated easily and surely.

As shown in FIG. 3B, the light-emitting device 31 is fixed on the chip carrier 22b via a submount 31c. The light-emitting device 31 comprises a light-emitting surface 31a and a light-reflecting surface 31b. The light-emitting surface 31a is optically coupled to the optical fiber 12 by an optical portion 13 including a lens. Thus light emitted from the light-emitting surface 31a is led through the optical portion 13 to the optical fiber 12. On the other hand, the light-reflecting surface 31b is optically coupled to the lens 32. Light leaking from the light-reflecting surface 31b of the light-emitting device 31 enters the lens 32. A distributed feedback (DFB) type or Fabry-Perot type semiconductor laser element, for example, may be used as the light-emitting device 31. In the following explanation, the light-emitting device 31 is supposed to be a single mode semiconductor laser element. The single mode laser element emits laser light in a very narrow wavelength region. Accordingly, the laser light may be considered as having a substantially single wavelength.

As shown in FIG. 3B, the lens 32 comprises an upper plane 32a and a lower plane 32b which are substantially parallel to one another. The lens 32 is fixed to the chip carrier 22b by a resinous adhesive or the like so that the lower plane 32b contacts the chip carrier 22b. The lens 32 is optically coupled to the light-reflecting surface 31b of the light-emitting device 31. The light leaking from the light-reflecting surface 31b is diverging, as shown in FIG. 3A. The diverging light passes through the lens 32 to be parallel light L. The photodetector 33a is disposed to be able to receive the parallel light transmitted through the lens 32. The photodetector 33a is disposed on a fixing member 37 installed in a standing manner on the chip carrier 22b. The photodetector 33a outputs a signal corresponding to the power of the received parallel light L.

The etalon 34 is optically coupled to the light-reflecting surface 31b of the light-emitting device 31 via the lens 32. In this embodiment, the etalon 34 is in parallel plate shape. The etalon 34 may also have a multilayer reflecting film on a light-receiving surface 34a and/or light-emitting surface 34b. The reflectance of the light-receiving surface 34a and/or light-emitting surface 34b may be modified by the multilayer reflecting film.

As shown in FIG. 3B, the etalon 34 is fixed on the chip carrier 22b. A roof 35 is disposed above the etalon 34. The cooler 21 is disposed below the chip carrier 22b. Thus the etalon 34 is interposed between the cooler 21 and the roof 35. The roof 35 will now be described with reference to FIG. 4.

Figure 4:
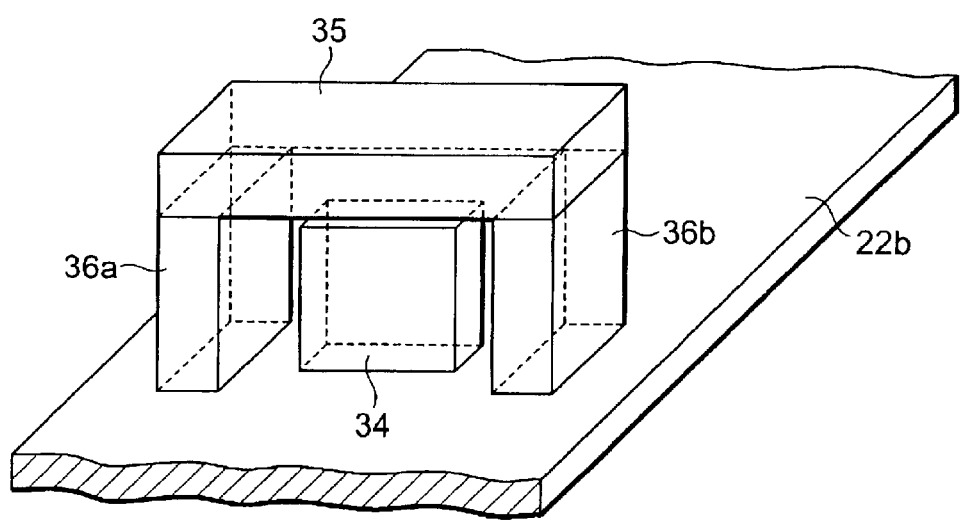
FIG. 4 is a schematic perspective view showing the disposition of an etalon and a roof.

FIG. 4 is a schematic perspective view showing the disposition of the etalon 34 and the roof 35. The roof 35 is a plate-shaped member. The roof 35 has a rectangular plane shape. The roof 35 is supported by supporting members 36a and 36b which are fixed onto the chip carrier 22b to be disposed above the etalon 34. There is a gap between the upper face of the etalon 34 and the roof 35. The supporting members 36a and 36b are thermally coupled to the thermoelectric cooler 21 via the L-carrier 22a and the chip carrier 22b. The supporting members 36a, 36b and the roof 35 may be joined by an adhesive or joined by welding. If an adhesive is used, an adhesive with good thermal conductivity is preferable. Alternatively, the roof 35 and the supporting members 36a, 36b may be provided integrally. In this case, the thermal conductivity between the roof 35 and the supporting members 36a, 36b will be further improved.

The roof 35 is thermally coupled to the thermoelectric cooler 21 via the supporting members 36a, 36b, the chip carrier 22b and the L-carrier 22a. Thus the chip carrier 22b, the roof 35, and the supporting members 36a, 36b are maintained at substantially equal temperatures by the cooler 21. Since the etalon 34 is surrounded by the roof 35, the supporting members 36a, 36b, and the chip carrier 22b which are maintained at the substantially equal temperatures, the temperature of the etalon 34 can also be maintained at the substantially same temperature. Thus the roof 35 has a function of regulating the temperature of the etalon 34 in cooperation with the supporting members 36a and 36b.

The roof 35 and the supporting members 36a, 36b are preferably composed of a good thermal conductor such as copper tungsten (CuW) or Kovar. According to the findings of the present inventors, when the etalon 34 is composed of common optical glass, for example, the thermal conductivity thereof is approximately 1.06 W/mK. In contrast, the thermal conductivity of CuW is 200 W/mK, and the thermal conductivity of Kovar is 16 W/mK. If the roof 35 and supporting members 36a, 36b are made of a material with such high thermal conductivity, the temperatures of the roof 35 and supporting members 36a, 36b can be regulated in a very short time when the temperature of the housing 11 changes. As a result, temperature change inside the housing 11 can be certainly prevented from affecting the etalon 34.

The photodetector 33b is fixed on a first plane 38a of a fixing member 38 provided on the chip carrier 22b. The first plane 38a faces the light-emitting surface 34b of the etalon 34. Thus the photodetector 33b is able to receive light emitted from the light-emitting surface 34b of the etalon 34. In this embodiment, the relative positional relationship between the photodetector 33b and the etalon 34 is determined so that light with a predetermined grid wavelength $\lambda_0$ transmitted through the etalon 34 with a predetermined temperature is detected by the photodetector 33b at a predetermined current value. By locking the output of the photodetector 33b at this current value, the wavelength of the laser light emitted from the light-emitting device 31 is locked at the grid wavelength $\lambda_0$. More specifically, the temperature of the light-emitting device 31 is adjusted via the chip carrier 22b and the wavelength of the laser light is stabilized by adjusting the temperature of the thermoelectric cooler 21 according to the output signal from the photodetector 33b.

The photodetectors 33a and 33b may, for example, be a InGaAs-pin photodiode with an InGaAs semiconductor layer, as a light-receiving window, formed on an InP substrate.

In the optical module 1, the etalon 34 is surrounded by the roof 35, supporting members 36a, 36b and chip carrier 22b, the temperatures of which are controlled. Thus the temperature of the etalon 34 becomes substantially equal to the temperatures of these components. Further, even if a large temperature difference occurs in the interior of the housing 11, the temperature difference is prevented from affecting the etalon 34. As a result, the temperature change in the etalon 34 is suppressed. Accordingly, the thermal expansion, heat shrinkage and refractive index change associated with the temperature change in the etalon 34 are suppressed, and therefore variation in the lock wavelength is suppressed.

Figure 5A:
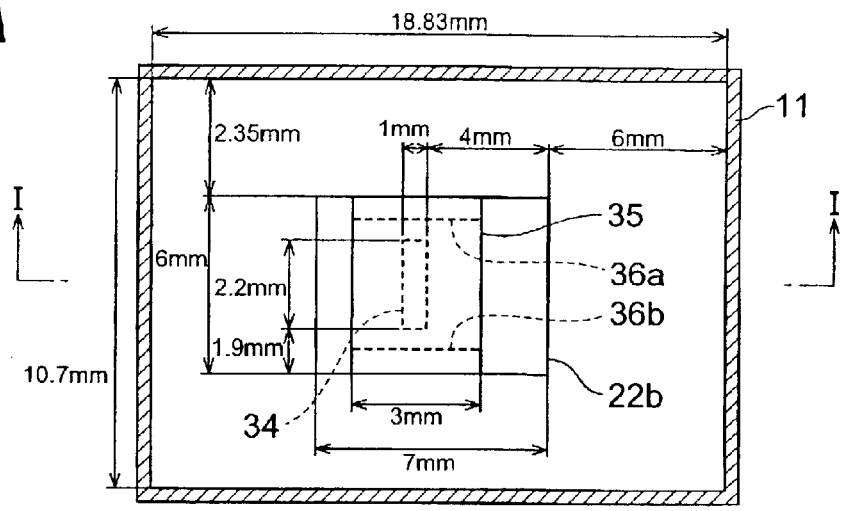
FIG. 5A is a plan view of a model used in simulations.
Figure 5B:
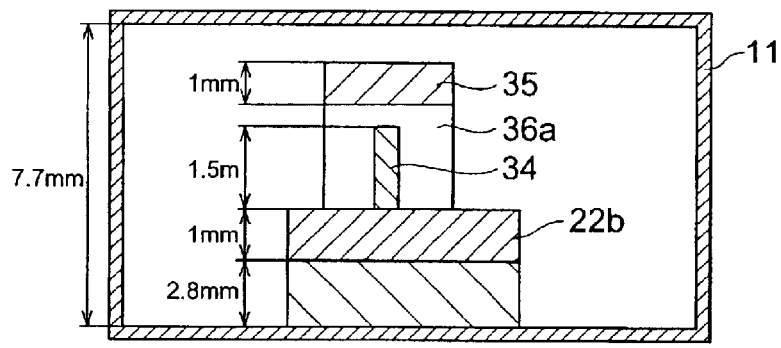
FIG. 5B is a schematic sectional view along the I—I line in FIG. 5A.
Figure 5C:
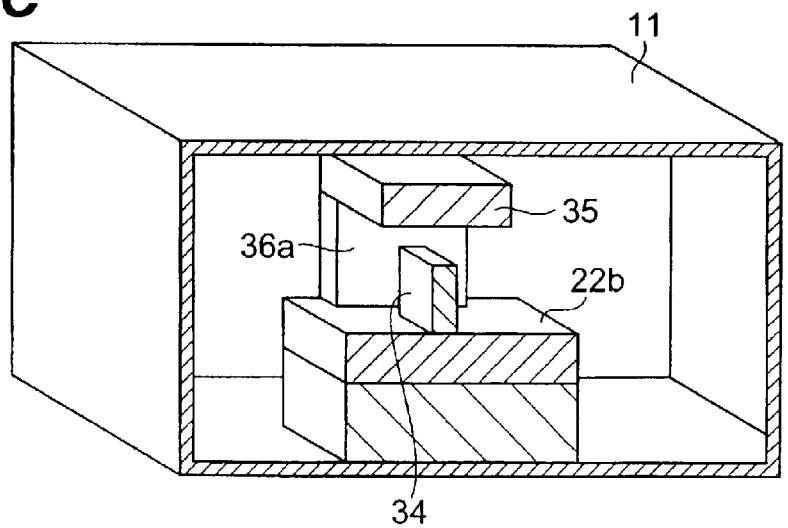
FIG. 5C is a schematic perspective view including the cross section along the I—I line in FIG. 5A.

A simulation performed by the inventors to confirm the effect of preventing the temperature change in the etalon 34 will now be described. FIG. 5A is a plan view showing a model used in this simulation. FIG. 5B is a schematic sectional view along the I—I line of the model in FIG. 5A, and FIG. 5C is a schematic perspective view of the model in FIG. 5A including the cross section along the I—I line. As shown in the figures, this model comprises the chip carrier 22b, the etalon, the roof 35, the supporting members 36a, 36b, and the housing 11. The chip carrier 22b is made of Si, and the etalon is made of common optical glass. Two simulations were performed: in one of the simulations, CuW are used as the material of the roof 35 and the supporting members 36a, 36b; and in the other simulation, Kovar is used. The dimensions of these members were set to the values shown in FIGS. 5A and 5B. The thermal conductivity of each member, used as the parameters of the simulation, are as follows:

Si: 168.0 (W/mK)
Optical glass: 1.060 (W/mK)
CuW: 200.0 (W/mK)
Kovar: 16.0 (W/mK)

In this simulation, the housing 11 was filled with nitrogen gas at a pressure of one atmosphere. The thermal conductivity of the nitrogen was set at 0.0260 W/mK, and the viscosity constant was set at $1.79 \times 10^{-5}$ Pa·s. The temperature of the chip carrier 22b was set at 25° C. and the temperature of the housing 11 at 60° C. Note that the numerical values in FIGS. 5A and 5B are illustrative values used as the parameters for the simulation, and the actual dimensions of the optical module 1 are not limited to these values.

Figure 6:
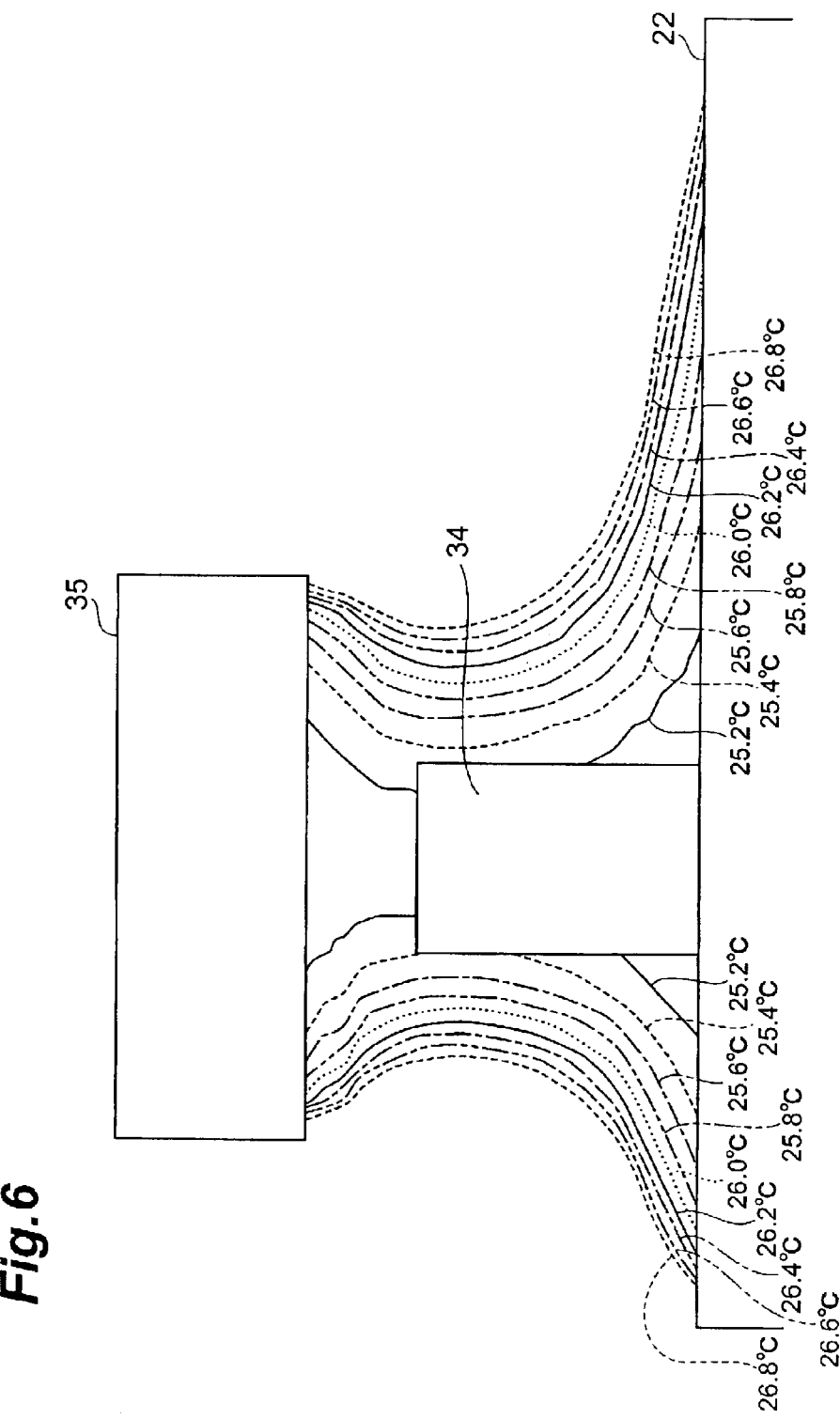
FIG. 6 shows an example of the temperature distribution in an etalon determined by the simulation.
Figure 7:
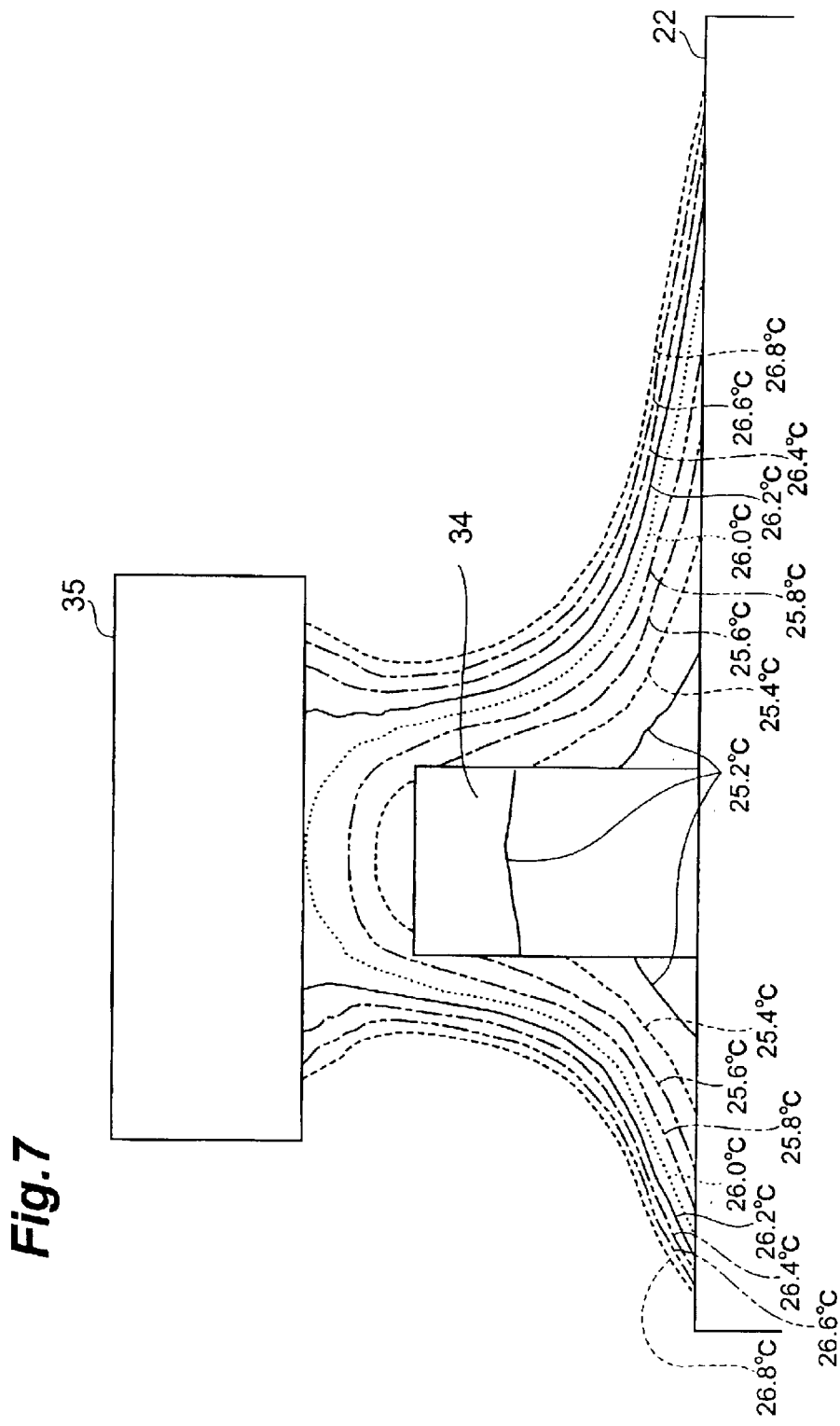
FIG. 7 shows another example of the temperature distribution in an etalon determined by the simulation.

FIGS. 6 and 7 are side views showing the temperature distribution on the periphery of the etalon in the optical module of this embodiment determined by the simulations. FIG. 6 shows the result of the simulation when the roof 35 and supporting members 36a, 36b are made of CuW, and FIG. 7 shows the result of the simulation when the roof 35 and the supporting members 36a, 36b are made of Kovar. The supporting members 36a, 36b are not shown in these figures.

As shown in FIG. 6, when the roof 35 and supporting members 36a, 36b are made of CuW, there is only a slight temperature difference of no more than 0.2° C. in the etalon 34. Further, when the roof 35 and supporting members 36a, 36b are made of Kovar, the temperature difference inside the etalon 34 is also approximately 0.2° C., as is shown in FIG. 7. Thus in either case, the wavelength of light transmitted through the etalon 34 to enter the photodetector 33b can be stabilized precisely.

Figure 8:
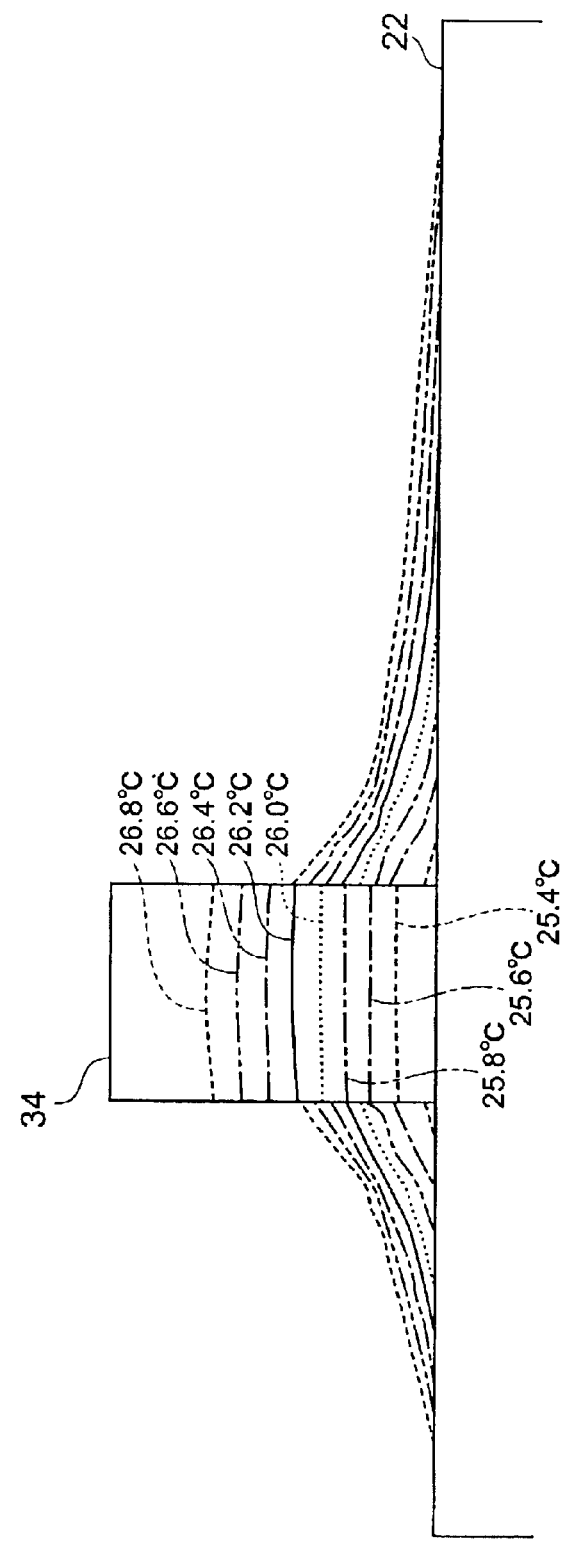
FIG. 8 shows the temperature distribution in an etalon determined by a simulation without roof and supporting members.

For comparison, a simulation was performed using an identical model to that of FIGS. 5A through 5C but removing the roof 35 and the supporting members 36a, 36b. The result is shown in FIG. 8. As shown in FIG. 8, a temperature gradient of approximately 1.2° C. was produced inside the etalon 34. The reason for this is the low thermal conductivity, approximately 1.06 W/mK, of the common optical glass composing the etalon 34. When a temperature gradient exists inside the etalon 34, temperature change in the laser-light-transmitting portion of the etalon occurs in response to even a slight change in the temperature of the housing 11. Furthermore, since the thermal conductivity of the etalon 34 is low, it is impossible to suppress the temperature change in the etalon 34 with good responsiveness. Thus when the roof 35 and the supporting members 36a, 36b are removed, it is difficult to certainly prevent the wavelength dependence of the transmittance of the etalon 34 from fluctuating in response to the temperature change in the etalon 34.

According to the findings of the inventors, the lock wavelength changes by approximately 0.013 nm as the temperature of an etalon composed of common optical glass changes by 1° C. According to the optical module 1 of this embodiment, even when a temperature difference of 35° C. between the housing 11 (60° C.) and the chip barrier 22b (25° C.) occurs, the temperature distribution in the etalon can be suppressed to approximately 0.2° C., and thus the variation in the lock wavelength can be suppressed to 0.003 nm or less. In other words, it is possible to control the wavelength precisely with less influence from the temperature change of the housing.

Other embodiments of the optical module according to the present invention will now be described. The optical modules of the second through fourth embodiments have identical constitutions to that of the optical module 1 of the first embodiment, except for the constitution on the periphery of the etalon 34. Accordingly, the explanations of the second through fourth embodiments will focus on the differences from the first embodiment.

Second Embodiment

Figure 9:
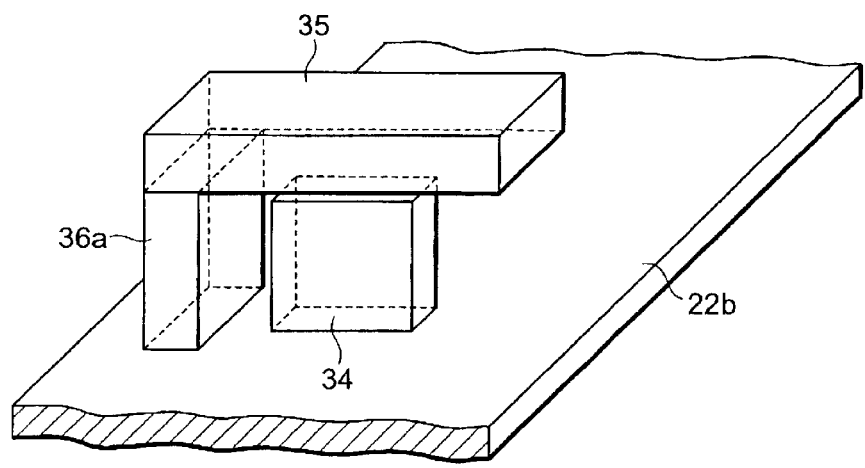
FIG. 9 is a schematic perspective view showing the disposition of an etalon, roof, and supporting member in an optical module of a second embodiment.

FIG. 9 is a schematic perspective view showing the disposition of an etalon, roof, and supporting member in an optical module of the second embodiment. As shown in the drawing, the roof 35 is supported by only a single supporting member 36a provided on the chip carrier 22b. The etalon 34 is fixed on the chip carrier 22b. The upper face of the etalon 34 opposes the roof 35, and one of the side faces of the etalon 34 opposes the supporting member 36a. The temperatures of the roof 35, supporting member 36a and chip carrier 22b are controlled by the thermoelectric cooler 21 to be substantially equal. Therefore, the temperature change in the etalon 34 is suppressed and variation in the lock wavelength is prevented. Thus the temperature of the etalon 34 is sufficiently stabilized even when the roof 35 is supported by only one supporting member 36a.

Third Embodiment

Figure 10A:
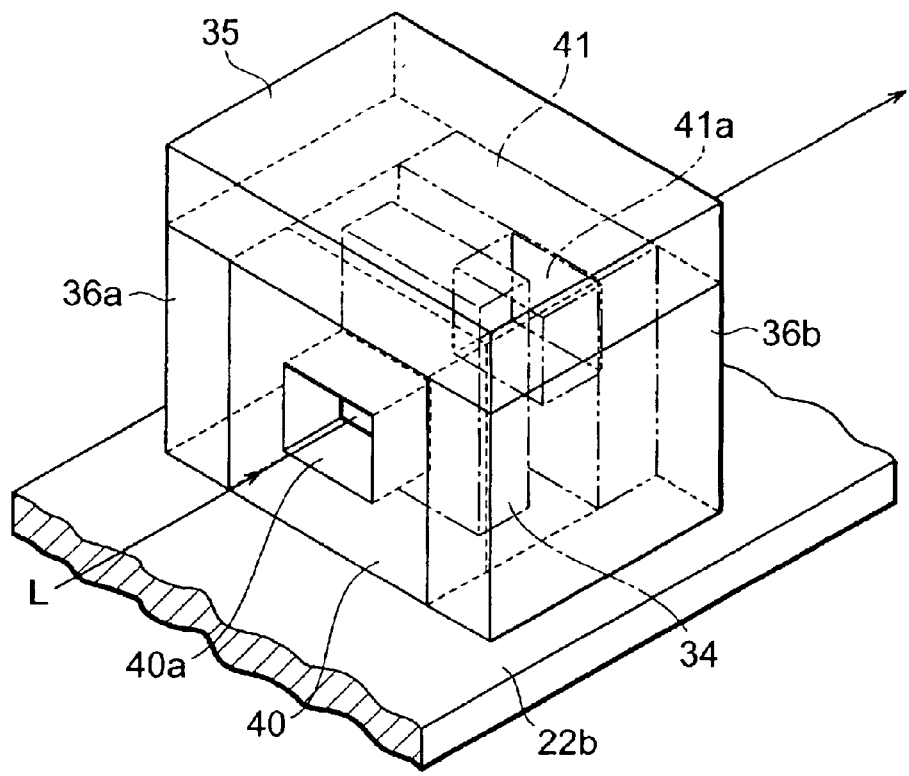
FIG. 10A is a schematic perspective view showing the periphery of an etalon in an optical module of a third embodiment.
Figure 10B:
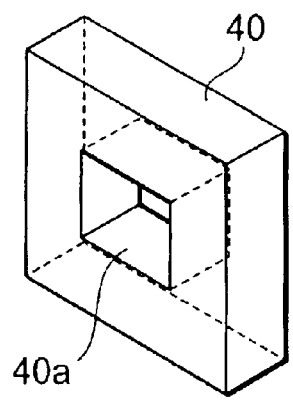
FIG. 10B is a perspective view showing an aperture member.

FIG. 10A is a schematic perspective view showing the periphery of an etalon in an optical module of the third embodiment. FIG. 10B is a perspective view showing an aperture member. As shown in FIG. 10A, the roof 35 is supported by supporting members 36a and 36b provided on the chip carrier 22b.

An aperture member 40 is placed on the light-receiving surface side of the etalon 34. The aperture member 40 is fitted into an end portion of an opening defined by the roof 35, supporting members 36a, 36b and chip carrier 22b. The aperture member 40 is apart from the light-receiving surface of the etalon 34. The aperture member 40 has an opening 40a, as shown in FIG. 10B. The opening 40a faces the light-receiving surface of the etalon 34. Light L which is emitted from the light-reflecting surface 31b of the light-emitting device 31 and which passes through the lens 32 then passes through the opening 40a to enter the light-receiving surface 34a of the etalon 34. The aperture member 40 is fixed on the chip carrier 22b and also contacts the supporting members 36a, 36b and the roof 35. The aperture member 40 is thermally coupled to the thermoelectric cooler 21 via the L-carrier 22a and the chip carrier 22b. Thus the temperature of the aperture member 40 is substantially identical to the temperatures of the chip carrier 22b, supporting members 36a, 36b and the roof 35.

An aperture member 41 is placed on the light-emitting surface side of the etalon 34. The aperture member 41 is fitted into an end portion of an opening defined by the roof 35, the supporting members 36a, 36b, and the chip carrier 22b. The aperture member 41 is apart from the light-emitting surface of the etalon 34. The aperture member 41 has the same constitution as the aperture member 40. The aperture member 41 is provided with an opening 41a through which light transmitted through the etalon 34 can pass. The opening 41a faces the light-emitting surface of the etalon 34 and photodetector 33b as well. Thus the transmitted light from the etalon 34 can pass through the opening 41a to reach the photodetector 33b. The aperture member 41 is fixed on the chip carrier 22b and also contacts the supporting members 36a, 36b and the roof 35. The aperture member 41 is thermally coupled to the thermoelectric cooler 21 via the L-carrier 22a and the chip carrier 22b. Thus the temperature of the aperture member 41 is substantially identical to the temperatures of the chip carrier 22b, supporting members 36a, 36b and the roof 35.

The aperture members 40 and 41 are preferably composed of a good thermal conductor such as CuW or Kovar. As noted above, these materials have higher thermal conductivity than an etalon made of common optical glass.

In the third embodiment, the etalon 34 is surrounded by the roof 35, the supporting members 36a, 36b, the aperture members 40, 41, and the chip carrier 22b. These components are maintained at a substantially equal temperature by the thermoelectric cooler 21. Thus, even if a large temperature difference occurs in the interior of the housing 11, the effects thereof can be prevented from reaching the etalon 34. As a result, the temperature change in the etalon 34 is suppressed and therefore the thermal expansion, heat shrinkage and refractive index change accompanying the temperature change in the etalon 34 are suppressed. Thereby, the variation in the lock wavelength is also suppressed. The exposed surface area of the etalon 34 is reduced due to the aperture members 40 and 41. Accordingly, the temperature change in the etalon 34 and the variation in the lock wavelength can be suppressed more certainly.

Fourth Embodiment

Figure 11:
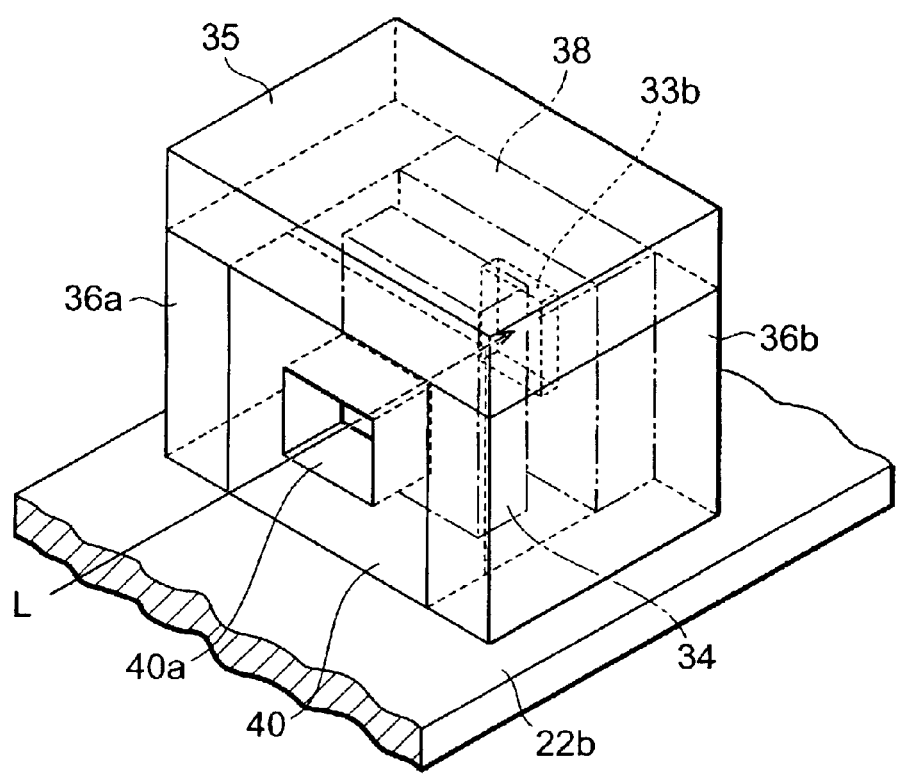
FIG. 11 is a schematic perspective view showing the periphery of an etalon in an optical module of a fourth embodiment.

FIG. 11 is a schematic perspective view of the periphery of an etalon in an optical module of the fourth embodiment. As shown in the drawing, the fourth embodiment is the same as the third embodiment in that the roof 35 is supported by the supporting members 36a and 36b and the aperture member 40 is provided. The fourth embodiment differs from the third embodiment in that the aperture member 41 is not used and the fixing member 38 to which the photodetector 33b is fixed is installed in place of the aperture member 41. The fixing member 38 contacts the roof 35 and the supporting members 36a, 36b. The fixing member 38 is provided on the chip carrier 22b and also contacts the roof 35 and supporting members 36a, 36b. The fixing member 38 is thermally coupled to the thermoelectric cooler 21 via the L-carrier 22a and the chip carrier 22b. Thus the temperature of the fixing member 38 is substantially identical to the temperatures of the chip carrier 22b, the roof 35 and the supporting members 36a, 36b.

The etalon 34 is surrounded by the roof 35, supporting members 36a, 36b, aperture member 40, fixing member 38, and chip carrier 22b, all of which are controlled to the substantially identical temperatures. Thus the temperature change in the etalon 34 is certainly suppressed, whereby the variation in the lock wavelength is also suppressed. The exposed surface area of the etalon 34 is reduced due to the aperture member 40 and the fixing member 38. Accordingly, the temperature change in the etalon 34 and the variation in the lock wavelength can be suppressed more certainly.

Fifth and sixth embodiments will now be described. In these embodiments, an optical device 50 comprising an etalon is used in place of the etalon 34, roof 35 and supporting members 36a and 36b in the above embodiments. The fifth and sixth embodiments differ from the first through fourth embodiments in that the roof 35 and supporting members 36a, 36b are not used. Apart from this point, the fifth and sixth embodiments have the same constitution as the optical module 1 of the first embodiment. The following description will focus on the differences.

Fifth Embodiment

Figure 12:
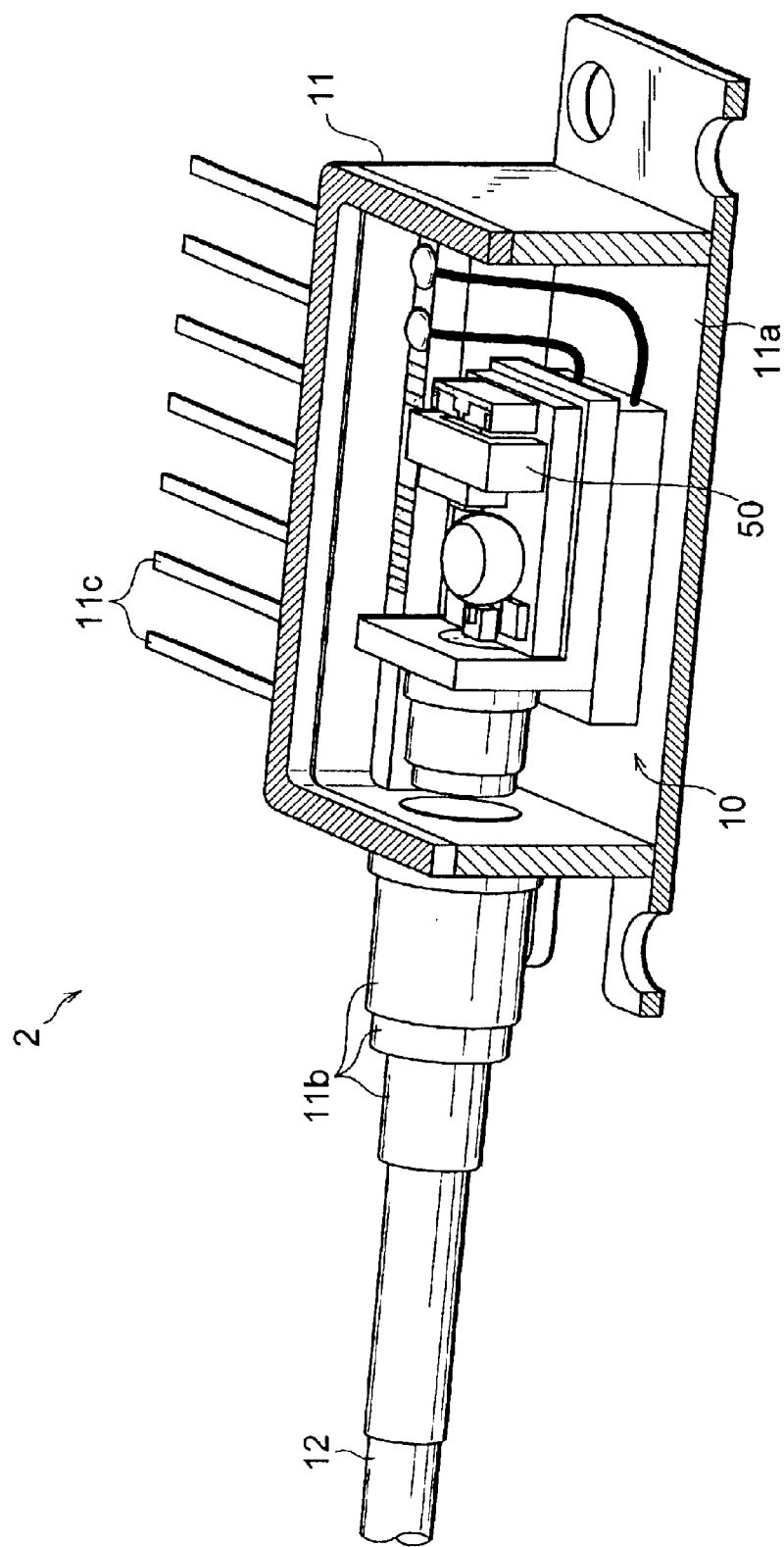
FIG. 12 is a partially cut-away perspective view of an optical module of a fifth embodiment.
Figure 13:
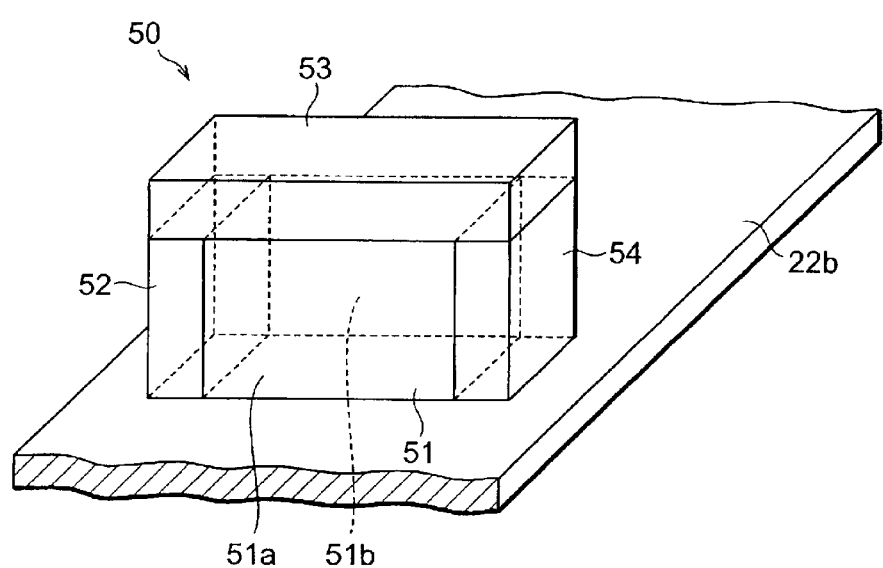
FIG. 13 is a perspective view showing an example of an optical device with an etalon.

FIG. 12 is a partially cut-away perspective view of an optical module 2 of the fifth embodiment. As shown in FIG. 12, the optical module 2 is provided with an optical device 50. FIG. 13 is a schematic perspective view showing the optical device 50. The optical device 50 is provided with an etalon 51 and frame members 52 to 54. The etalon 51 is in parallel plate shape. The relative positional relationship between the photodetector 33b and the etalon 51 is determined so that light with a predetermined grid wavelength $\lambda_0$ transmitted through the etalon 51 with a predetermined temperature is detected by the photodetector 33b at a predetermined current value. The frame members 52 to 54 are attached to three adjacent faces of the etalon 51 excluding the light-receiving surface 51a and the light-emitting surface 51b. The frame member 53, which is positioned above the etalon 51, corresponds to the roof 35 of the first through fourth embodiments. The frame members 52 to 54 serve as a holder for holding the etalon 51 so that the light-receiving surface 51a and light-emitting surface 51b are exposed. The frame members 52 to 54 are made of a material with high thermal conductivity such as CuW or Kovar, for example. The frame members 52 to 54 have higher thermal conductivity than the etalon 51.

As shown in FIG. 13, the optical device 50 is fixed on the chip carrier 22b so that the bottom face of the etalon 51 to which the frame members 52 to 54 are not attached contacts the chip carrier 22b. The frame members 52 to 54 are thermally coupled to the thermoelectric cooler 21 via the L-carrier 22a and the chip carrier 22b. The frame members 52 to 54 are made of a material with higher thermal conductivity than that of the etalon 51, and therefore all of the frame members 52 to 54 have substantially equal temperatures to the temperature of the chip carrier 22b. Thus the etalon 51 surrounded by the chip carrier 22b and the frame members 52 to 54 on four sides, all of which have equal temperatures, is also maintained at the substantially same temperature. As a result, thermal expansion, heat shrinkage and refractive index change in the etalon 51 are prevented and the variation in the lock wavelength is suppressed.

The bottom surface of the optical device 50 contacts the chip carrier 22b and no frame member is attached thereto. Accordingly, UV cured resin may be used to fix the optical device 50 onto the chip carrier 22b. More specifically, UV cured resin is applied to the contact surface first. Then the contact surface on which UV cured resin has been applied is brought toward the chip carrier 22b to place the optical device 50 on the chip carrier 22b and then optical axis adjustment is performed. Thereafter, ultraviolet light is irradiated through the etalon 51 to cure the UV cured resin. Thereby, the optical device 50 is fixed on the chip carrier 22b. This procedure enables the optical device 50 to be attached to the chip carrier 22b easily.

Sixth Embodiment

An optical module of the sixth embodiment has the same constitution as the optical module of the fifth embodiment, except that a different optical device is used. The following description will focus on the differences.

Figure 14A:
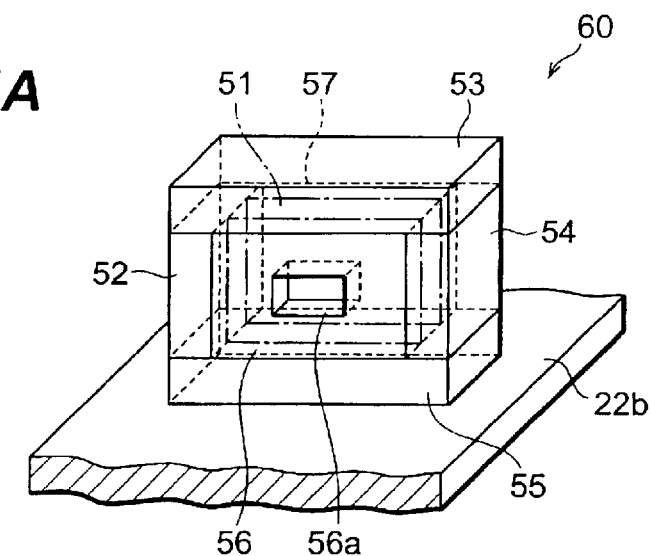
FIG. 14A is a perspective view showing another example of an optical device comprising an etalon.
Figure 14B:
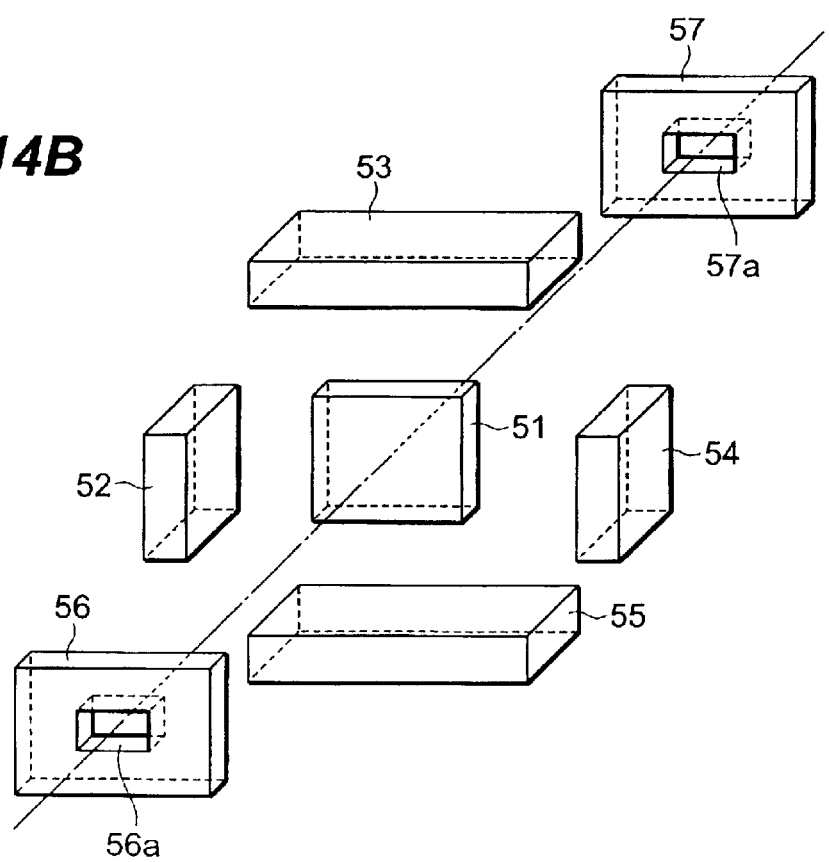
FIG. 14B is an exploded perspective view showing the structure of the optical device of FIG. 14A.

FIG. 14A is a schematic perspective view showing an optical device 60 used in the sixth embodiment. FIG. 14B is an exploded perspective view showing the structure of the optical device 60. The optical device 60 is provided with an etalon 51, frame members 52 through 55, and cover members 56 and 57. The frame members 52 through 55 and the cover members 56, 57 are made of a material with high thermal conductivity such as CuW or Kovar, for example. These members have higher thermal conductivity than that of the etalon 51. These members are thermally coupled to the thermoelectric cooler 21 via the L-carrier 22a and the chip carrier 22b.

The frame members 52 to 55 are attached to four sides of the etalon 51 excluding the light-receiving surface 51a and the light-emitting surface 51b. The frame member 53 placed above the etalon 51 corresponds to the roof 35 of the first through fourth embodiments. The cover member 56 is attached to contact the light-receiving surface of the etalon 51, and the cover member 57 is attached to contact the light-emitting surface of the etalon 51. The cover members 56 and 57 have openings 56a and 57a, respectively. The opening 56a faces the light-receiving surface of the etalon 51. The opening 57a faces the light-emitting surface of the etalon 51. The frame members 52 to 55 and cover members 56 and 57 serve as a holder for holding the etalon 51 so that the light-receiving surface and light-emitting surface of the etalon 51 are exposed. Light from the light-emitting device 31 is transmitted through the lens 32 and then enters the light-receiving surface of the etalon 51 through the opening 56a. The light can be transmitted through the etalon 51 and passes through the opening 57a from the light-emitting surface of the etalon 51 to reach the photodetector 33b.

An optical device 60 is fixed on the chip carrier 22b so that the frame member 55 contacts the chip carrier 22b. Thus the frame members 52 to 55 and the cover members 56, 57 are maintained at temperatures substantially equal to the temperature of the chip carrier 22b. All of the surfaces of the etalon 51, excluding portions exposed from the openings 56a and 56b of the cover members 56 and 57, are covered by the frame members 52 to 55 and cover members 56 and 57. As a result, the etalon 51 is maintained at a temperature substantially equal to the temperatures of the frame members 52 to 55 and the cover members 56, 57. Thereby, the variation in the lock wavelength is suppressed.

Since the etalon 51 is covered by the frame members 52 to 55 and cover members 56 and 57, the size of the etalon 51 can be reduced. As a result, the material costs of the etalon can be decreased. Further, on producing the optical module, the installation of the optical device 60 can be completed simply by placing the optical device 60 on the chip carrier 22b, performing optical axis adjustment and then fixing the optical device 60 if the optical device 60 is prepared in advance. Therefore the producing process of the optical module is simplified.

In the optical device 60, the etalon 51 is covered by the frame members 52 to 55 and cover members 56, 57. However, either one of the cover members 56 and 57 alone may be provided. Furthermore, the frame members 52 to 55 may be provided integrally so that the etalon 51 is surrounded by the integral-type frame member. The cover members 56 and 57 may be fixed to the integral-type frame member.

Seventh Embodiment

An optical module of the seventh embodiment has the same constitution as the optical module of the fifth embodiment except that a different optical device is used. The following description will focus on the differences.

Figure 15A:
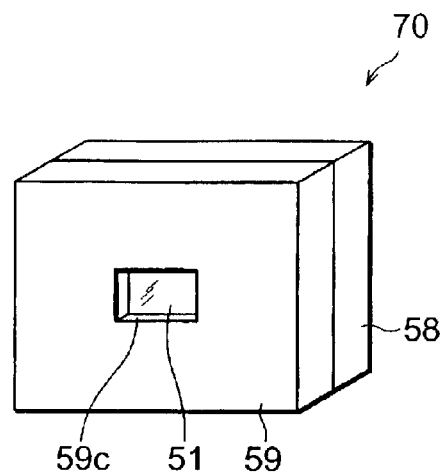
FIG. 15A is a perspective view showing a further example of an optical device.
Figure 15B:
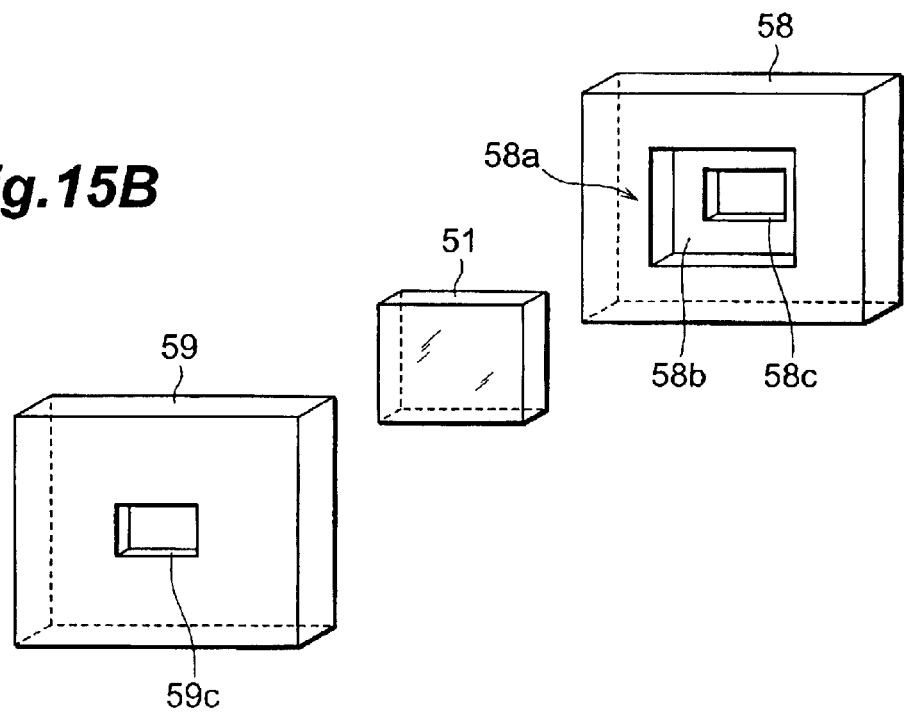
FIG. 15B is an exploded perspective view showing the structure of the optical device of FIG. 15A.

FIG. 15A is a perspective view showing an optical device 70 used in this embodiment. FIG. 15B is an exploded perspective view showing the optical device 70. The optical device 70 is provided with the etalon 51 and holding members 58 and 59. The holding members 58, 59 are thermally coupled to the thermoelectric cooler 21 via the L-carrier 22a and chip carrier 22b. The holding members 58 and 59 serve as a holder for holding the etalon 51 so that the light-receiving surface and light-emitting surface of the etalon 51 are exposed. The holding members 58, 59 are made of a material with high thermal conductivity such as CuW or Kovar, for example. These members have higher thermal conductivity than the etalon 51.

The holding member 58 has a recess 58a in which the etalon 51 is contained. An opening 58c is provided in the bottom face 58b of the recess 58a. The holding member 59 also has an opening 59c and a recess (not shown) for containing the etalon 51, like the holding member 58. The opening 58c opposes one of the light-receiving surface and the light-emitting surface of the etalon 51, and the opening 59c opposes the other. Light from the light-emitting device 31 enters and exits the etalon 51 through these openings.

The temperature of the etalon 51 is controlled by the thermoelectric cooler 21 via the holding members 58 and 59, and thus the temperature change in the etalon 51 is suppressed. As a result, the variation in the lock wavelength is suppressed. Further, since the etalon 51 is covered by the holding members 58 and 59, the size of the etalon 51 can be reduced. As a result, the material costs of the etalon can be decreased. Moreover, on producing the optical module, the installation of the optical device 70 can be completed simply by placing the optical device 70 on the chip carrier 22b, performing optical axis adjustment and then fixing the optical device 70 if the optical device 70 is prepared in advance. Therefore the producing process of the optical module is simplified.

Eighth Embodiment

An eighth embodiment will now be described. In the first through seventh embodiments, a parallel plate shaped etalon with the light-receiving surface and light-emitting surface parallel to each other is used. However, a wedge etalon in which a light-receiving surface and light-emitting surface are inclined relative to one another may be used instead. The optical module of the eighth embodiment has constitution in which the parallel plate shaped etalon in the first embodiment is replaced with a wedge etalon. Apart from this, the eighth embodiment has the same constitution as the optical module 1 of the first embodiment. The following description will focus on the differences.

Figure 16A:
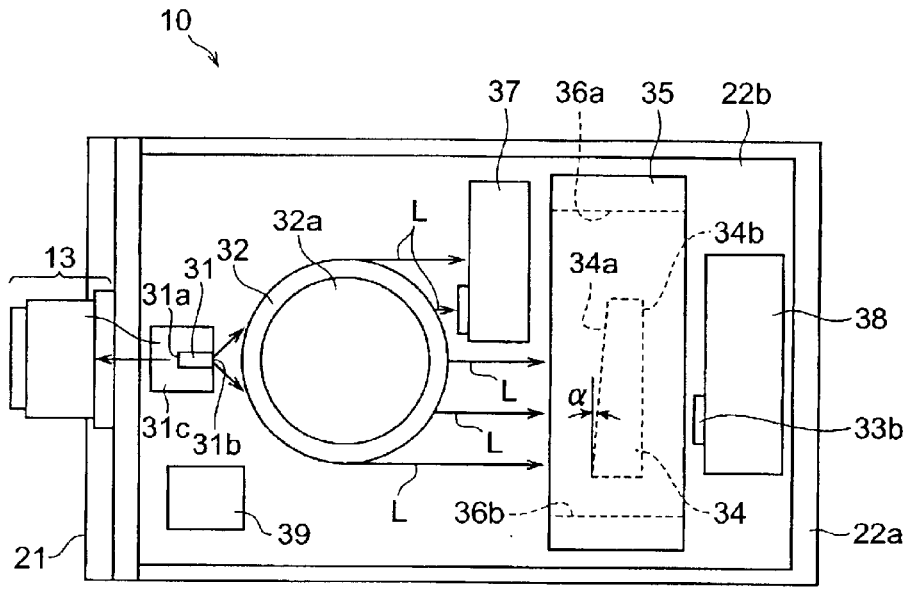
FIG. 16A is a plan view showing the main portion of an optical module of an eighth embodiment.
Figure 16B:
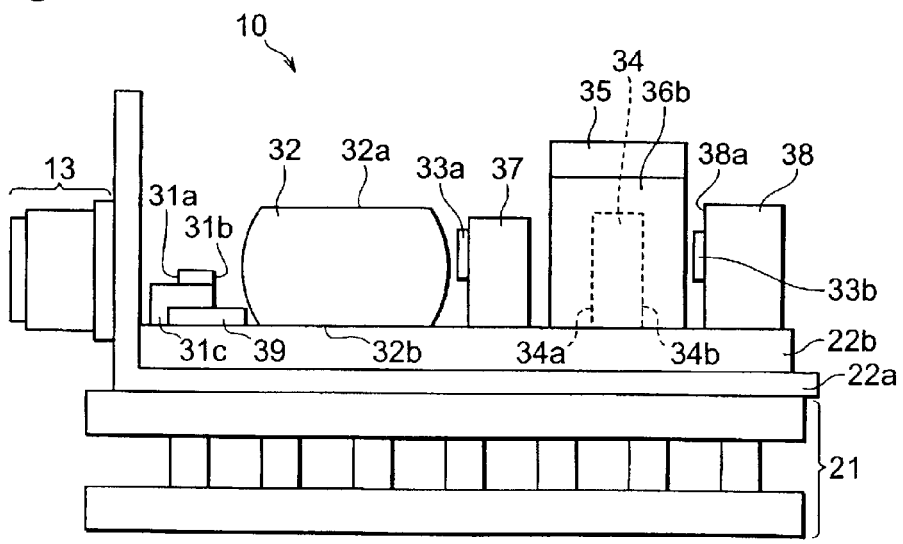
FIG. 16B is a side view showing the main portion.
Figure 17:
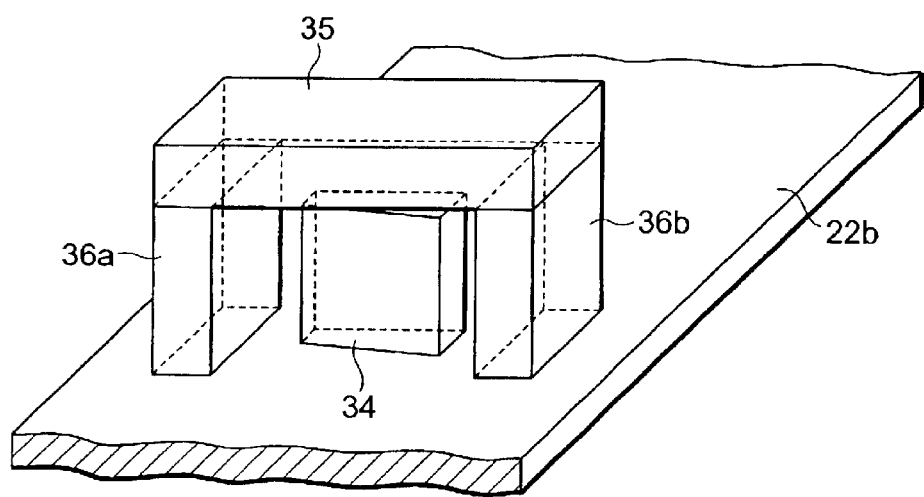
FIG. 17 is a schematic perspective view showing the periphery of a wedge etalon in the eighth embodiment.

FIG. 16A is a plan view showing the main portion 10 of the optical module of this embodiment. FIG. 16B is a side view of the main portion 10. FIG. 17 is a schematic perspective view showing the periphery of the wedge etalon 34. In the wedge etalon 34, the light-receiving surface 34a and light-emitting surface 34b are inclined relative to one another at a slight angle α. In this case, the angle α is determined in a range in which light incident on the etalon 34 is able to cause multiple beam interference between the light-receiving surface 34a and the light-emitting surface 34b. More specifically, the angle α is preferably no less than 0.01° and no more than 0.1°. A multilayer reflecting film may be provided on the light-receiving surface 34a and/or light-emitting surface 34b. The reflectance of the light-receiving surface 34a and/or light-emitting surface 34b may be modified by the multilayer reflecting film.

The temperature change in the etalon 34 is suppressed by the roof 35 and supporting members 36a and 36b, as in the first embodiment, even when the wedge etalon 34 is used. Thus the variation in the lock wavelength is suppressed.

The light-receiving surface 34a and light-emitting surface 34b of the wedge etalon 34 are inclined with respect to each other, and therefore the interval between these surfaces 34a and 34b changes along the direction of incline. As a result, the transmission wavelength of the wedge etalon 34 also changes along the direction of incline. This structure is beneficial when mounting the wedge etalon 34 on the chip carrier 22b. That is, when mounting the wedge etalon 34, it is possible to position the wedge etalon 34 by translating the wedge etalon 34. When a parallel plate shaped etalon is used, if the etalon is not disposed in a predetermined orientation, the desired lock wavelength cannot be obtained. Thus, when mounting a parallel plate shaped etalon, it is necessary to adjust the orientation by rotating the etalon. With a wedge etalon, on the other hand, the desired lock wavelength can be obtained without adjusting the orientation thereof by translating the wedge etalon to adjust the transmission wavelength. Therefore, since the positioning by means of rotation is unnecessary during mounting, the wedge etalon can be mounted easily.

A wedge etalon may also be used in place of the parallel plate shaped etalon in the second through seventh embodiments. Since there is almost no difference between the parallel plate shaped etalon and the wedge etalon regarding temperature change, the change in the lock wavelength can be suppressed even when a wedge etalon is used.

The etalon in the above embodiments is used to produce light with a power corresponding to the wavelength of light emitted from the light-emitting device 31. Such function of an etalon may also be obtained using another optical element with wavelength-dependent transmittance. Like an etalon, the transmittance characteristic of such an optical element changes in response to the temperature change therein. Accordingly, the present invention may also be applied to an optical module comprising this type of optical element in place of an etalon. An optical filter can be cited as an example of this type of optical element. Embodiments in which an optical filter is used instead of an etalon will be described below.

Ninth Embodiment

In this embodiment, an optical filter is provided in place of the etalon 34 in the optical module 1 shown in FIGS. 2 through 4. Apart from this, the ninth embodiment has the same constitution as the optical module 1 of the first embodiment. The following description will focus on the differences.

The optical filter may be anyone of a short-wavelength pass filter, a long-wavelength pass filter or a band-pass filter. The optical filter is thermally coupled to the thermoelectric cooler 21 via the L-carrier 22a and the chip carrier 22b. The relative positional relationship between the photodetector 33b and the optical filter is determined so that light with a predetermined grid wavelength $\lambda_0$ transmitted through the optical filter with a predetermined temperature is detected by the photodetector 33b at a predetermined current value.

Figure 18A:
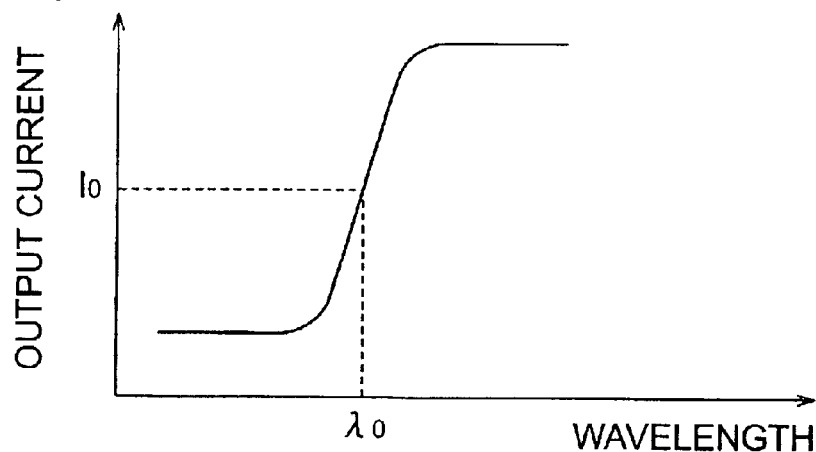
FIGS. 18A–18C illustrate the relationships between the wavelength of output light from a light-emitting device and the output current of a photodetector in relation to an optical module of a ninth embodiment.
Figure 18B:
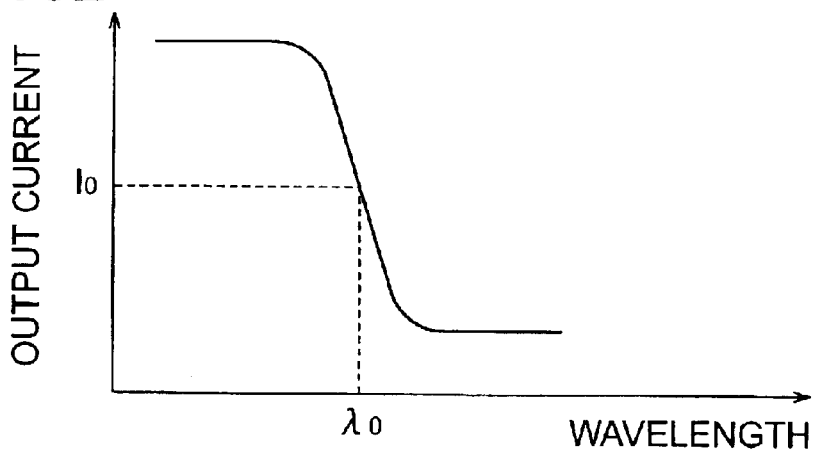
Figure 18C:
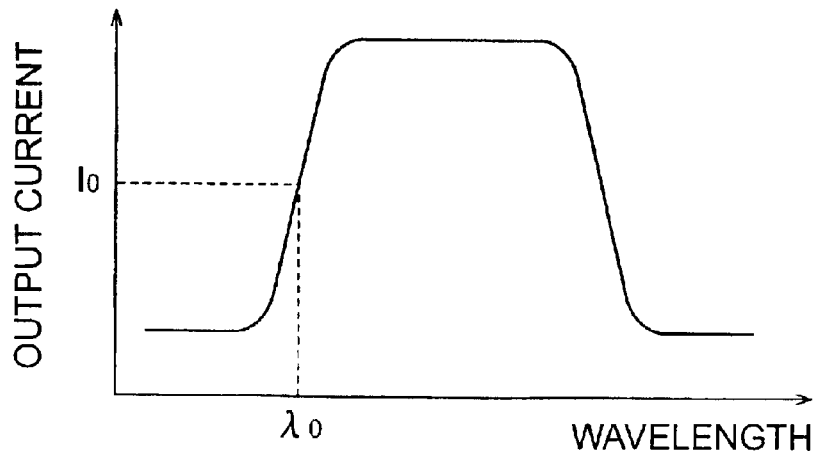

FIGS. 18A through 18C show the relationships between the wavelength of the output light from the light-emitting device 31 and the output current of the photodetector 33b for the optical module of this embodiment. The wavelength-output current relationships when a long-wavelength pass filter is used, when a short-wavelength pass filter is used and when a band-pass filter is used are shown in FIG. 18A, FIG. 18B and FIG. 18C, respectively. In this embodiment, the light-emitting device 31 is a single mode semiconductor laser element. In the figures, the output current corresponds to the transmittances of the filters.

As shown in FIGS. 18A through 18C, the transmittance characteristics of the filters in use include regions in which the wavelength and the transmittance uniquely correspond to each other. Therefore the wavelengths included in these regions correspond uniquely to the output current of the photodetector 33b. Accordingly, the wavelength of the output laser light from the light-emitting device 31 can be determined based on the output current of the photodetector 33b. When light with wavelength $\lambda_0$ enters the photodetector 33b, the output current value of the photodetector 33b becomes $I_0$. When the grid wavelength used in a WDM system is $\lambda_0$, the wavelength of the laser light can be locked at the grid wavelength $\lambda_0$ by adjusting the temperature of the light-emitting device 31 so that the output current becomes $I_0$.

Advantages similar to those in the first embodiment can also be obtained in this embodiment in which an optical filter is used instead of the etalon 34. That is, the optical filter is surrounded by the roof 35, supporting members 36a, 36b and the chip carrier 22b. The temperatures of the roof 35, supporting members 36a, 36b and chip carrier 22b are controlled to the substantially same value by the thermoelectric cooler 21. Therefore temperature change in the optical filter is suppressed, and accordingly the variation in the lock wavelength is suppressed.

The variation in the lock wavelength can be likewise suppressed when an optical filter is used instead of the etalon in the second through seventh embodiments.

Tenth Embodiment

The disposition of the components in the main portion 10 in this embodiment differs from that in the ninth embodiment. That is, the photodetector 33b is disposed to receive light reflected by the optical filter in this embodiment. Apart from this, the tenth embodiment has the same constitution as the optical module of the ninth embodiment. The following description will focus on the differences.

Figure 19A:
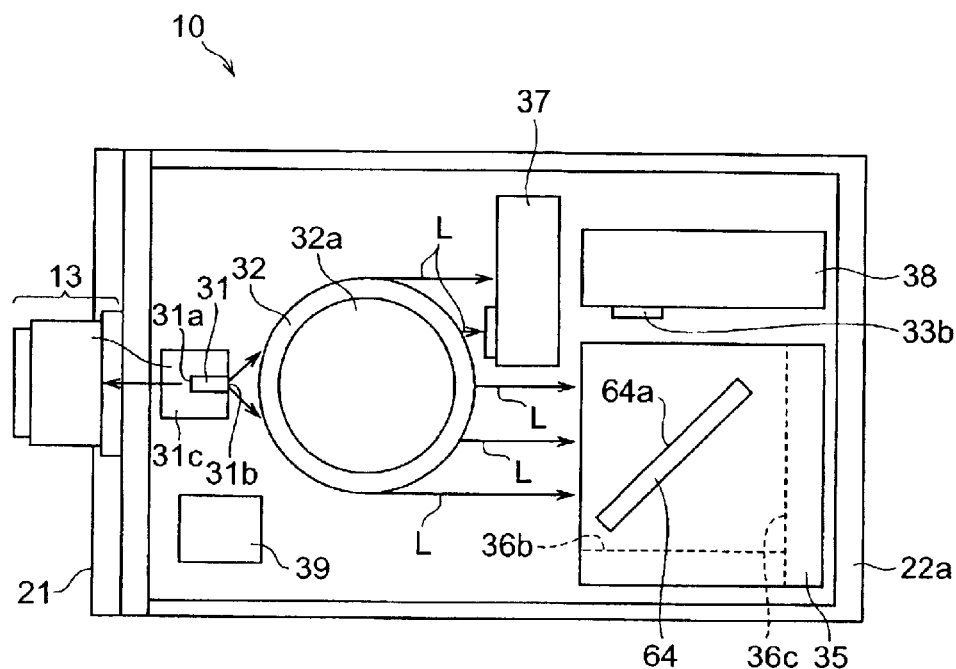
FIG. 19A is a plan view showing the main portion of an optical module of a tenth embodiment.
Figure 19B:
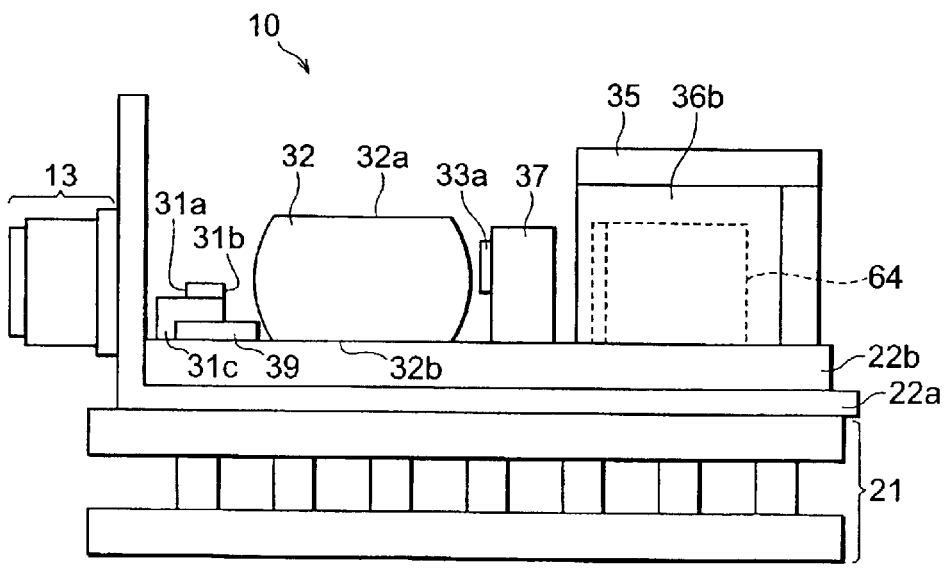
FIG. 19B is a side view showing the main portion.
Figure 20:
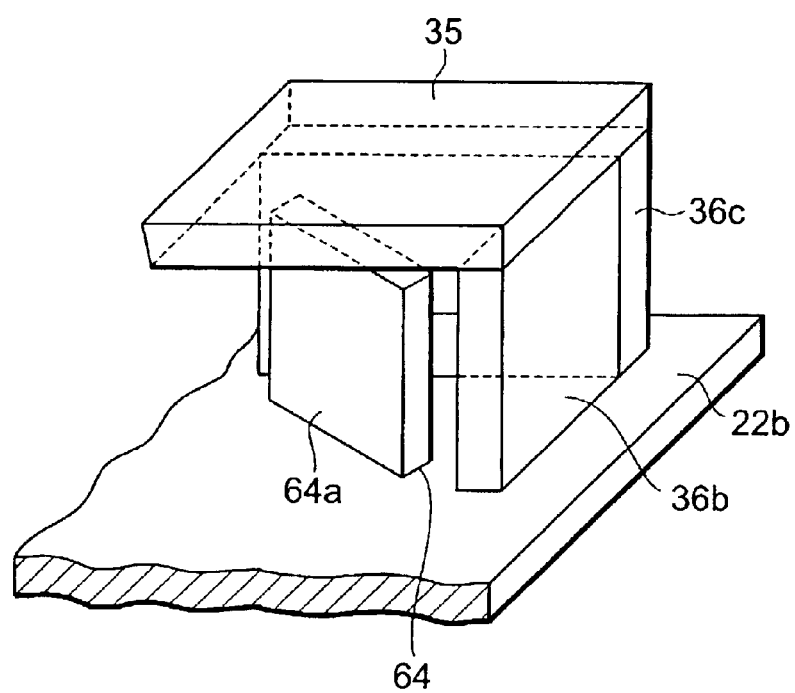
FIG. 20 is a schematic perspective view showing the periphery of an optical filter in the tenth embodiment.

FIG. 19A is a plan view showing the main portion 10 of the optical module of this embodiment. FIG. 19B is a side view of the main portion 10. FIG. 20 is a schematic perspective view showing the periphery of an optical filter 64. The optical filter 64 is placed on the chip carrier 22b. The optical filter 64 is thermally coupled to the thermoelectric cooler 21 via the L-carrier 22a and the chip carrier 22b. The optical filter 64 is optically coupled to the light-emitting device 31 via the lens 32. The light-receiving surface 64a of the filter 64 is inclined relative to the traveling direction of the parallel light L emitted from the lens 32. The photodetector 33b faces the light-receiving surface 64a. As a result, the photodetector 33b is able to receive light reflected by the light-receiving surface 64a of the filter 64. The filter 64 has wavelength-dependent optical reflectance. That is, the optical reflectance of the filter is dependent on the wavelength of light incident on the filter. The relative positional relationship between the photodetector 33b and the filter 64 is determined so that light with a predetermined grid wavelength $\lambda_0$ reflected by the optical filter 64 with a predetermined temperature is detected by the photodetector 33b at a predetermined current value.

The roof 35 is disposed above the optical filter 64. The roof 35 is supported by supporting members 36b and 36c fixed on the chip carrier 22b. The supporting members 36b, 36c are connected to two adjacent sides of the roof 35. The optical filter 64 is disposed between the lens 32 and the supporting member 36c. The roof 35 is thermally coupled to the thermoelectric cooler 21 via the supporting members 36b, 36c. The roof 35 and the supporting members 36b, 36c may be joined by an adhesive, or may be joined by welding. If an adhesive is used, an adhesive with high thermal conductivity is preferable. Alternatively, the roof 35 and supporting members 36b, 36c may be provided integrally. In this case, the thermal conductivity between the roof 35 and the supporting members 36b, 36c will be further improved.

The photodetector 33b detects components of the output light from the light-emitting device 31 which are reflected by the optical filter 64. Thus the output current of the photodetector 33b is affected by the reflection characteristic of the optical filter 64. In other words, the reflection wavelength region of the optical filter 64 influences the output current of the photodetector 33b.

Figure 21A:
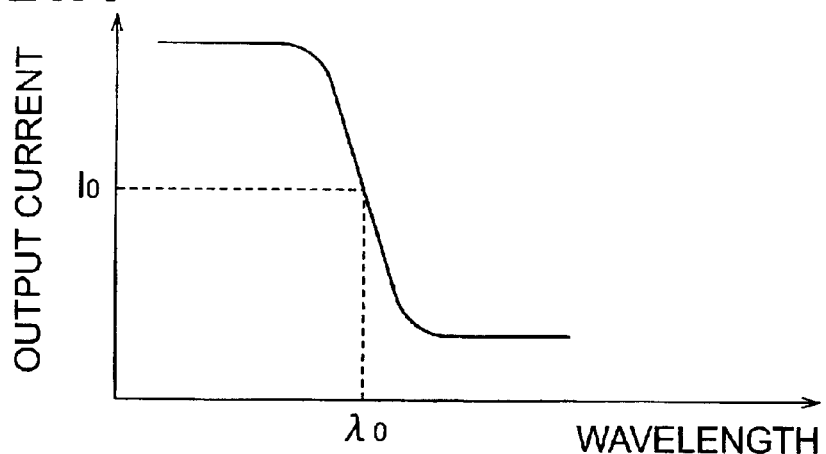
FIGS. 21A–21C illustrate the relationships between the wavelength of output light from a light-emitting device and the output current of a photodetector in relation to an optical module of the tenth embodiment.
Figure 21B:
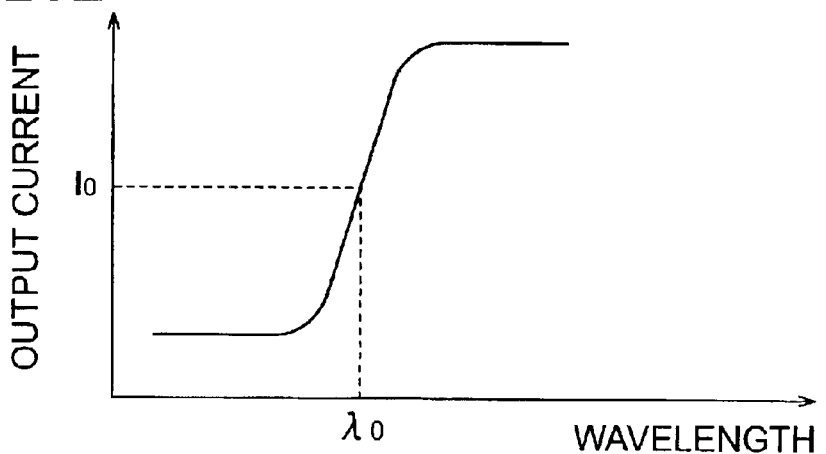
Figure 21C:
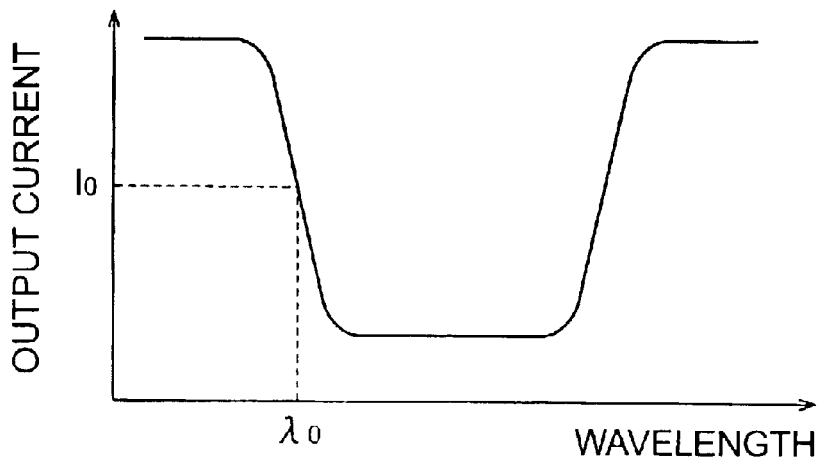

The optical filter 64 may be any one of a short-wavelength pass filter, a long-wavelength pass filter or a band-pass filter. FIGS. 21A through 21C show the relationships between the wavelength of the output light from the light-emitting device 31 and the output current of the photodetector 33b. The wavelength-output current relationships when a long-wavelength pass filter is used, when a short-wavelength pass filter is used and when a band-pass filter is used are shown in FIG. 21A, FIG. 21B and FIG. 21C, respectively. In this embodiment, the light-emitting device 31 is a single mode semiconductor laser element. In the figures, the output current corresponds to the reflectances of the filters.

As shown in FIGS. 21A through 21C, the reflection characteristics of the filters in use include regions in which the wavelength and the reflectance uniquely correspond to each other. Therefore the wavelengths included in these regions correspond uniquely to the output current of the photodetector 33b. Accordingly, the wavelength of the output laser light from the light-emitting device 31 can be determined based on the output current of the photodetector 33b. When light with wavelength $\lambda_0$ enters the photodetector 33b, the output current value of the photodetector 33b becomes $I_0$. When the grid wavelength used in a WDM system is $\lambda_0$, the wavelength of the laser light can be locked at the grid wavelength $\lambda_0$ by adjusting the temperature of the light-emitting device 31 so that the output current becomes $I_0$.

Advantages similar to those in the first embodiment can also be obtained in this embodiment. That is, the optical filter 64 is surrounded by the roof 35, supporting members 36b, 36c and the chip carrier 22b. The temperatures of the roof 35, supporting members 36b, 36c and chip carrier 22b are controlled to the substantially same value by the thermoelectric cooler 21. Therefore temperature change in the optical filter is suppressed, and accordingly the variation in the lock wavelength is suppressed.

The variation in the lock wavelength can be likewise suppressed when an optical filter is used instead of the etalon in the second through seventh embodiments and photodetector 33b is disposed to receive the light from the laser element 31 reflected by the filter. Thus the present invention can be applied to an optical module which monitors the output wavelength of a light-emitting device based on the power of reflected light from an optical filter.

In the third embodiment, the aperture member 41 with the opening facing the light-emitting surface of the etalon 34 is used. However, when the etalon 34 is replaced with an optical filter and reflected light of the filter is detected, a cover member without opening may be used instead of the aperture member 41. In the fourth embodiment, the fixing member 38 is disposed so that the photodetector 33b faces the light-emitting surface of the etalon 34. However, when the etalon 34 is replaced with an optical filter and reflected light of the filter is detected, the fixing member 38 is disposed so that the photodetector 33b faces the light-receiving surface of the filter to receive the reflected light of the filter. In both cases, the fixing member 38 is disposed so that the photodetector 33b receives the light from the light-emitting element 31 via the etalon or filter. In the sixth and seventh embodiments, the cover member and holding member having openings facing the light-emitting surface of the etalon 51 are used. However, when the etalon 51 is replaced with an optical filter and reflected light of the filter is detected, such openings are not needed. In this case, the photodetector 33b is disposed to face the light-receiving surface of the filter and receive the light from the light-emitting element 31 reflected by the filter.

Eleventh Embodiment

This embodiment differs from the ninth embodiment in that the light-emitting device 31 is a multimode semiconductor laser element rather than a single mode laser element used in the ninth embodiment. Apart from this, the eleventh embodiment has the same constitution as the optical module of the ninth embodiment. The following description will focus on the differences.

The light-emitting device 31 emits multimode laser light. Accordingly the optical module of this embodiment has a plurality of lock wavelengths corresponding to the modes of the light-emitting device 31. When the optical module is used in an optical transmission system, the central wavelengths of the modes are locked at certain wavelengths.

Figure 22A:
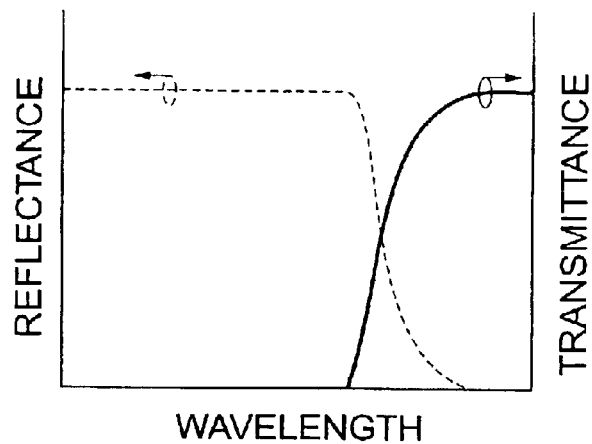
FIGS. 22A–22C illustrate characteristics of a long-wavelength pass filter, band-pass filter, and short-wavelength pass filter.
Figure 22B:
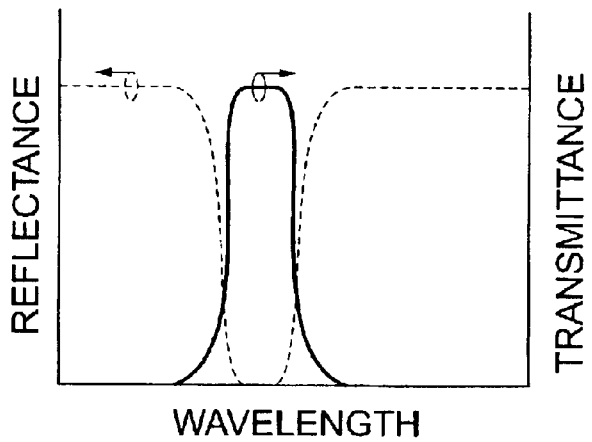
Figure 22C:
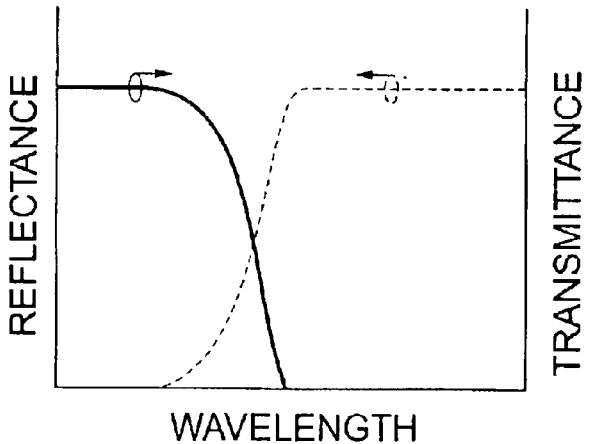

In this embodiment, an optical filter is provided instead of the etalon 34 in the optical module 1 shown in FIGS. 2 through 4. The optical filter may be any one of a short-wavelength pass filter, long-wavelength pass filter or band-pass filter. FIGS. 22A through 22C show the transmission characteristics and blocking characteristics of a long-wavelength pass filter, band-pass filter and short-wavelength pass filter, respectively. The solid lines in the figures indicate the transmission wavelength regions, and the broken lines indicate the reflection wavelength regions. The shapes of the transmission and reflection regions can be realized on dielectric multilayer film filters. As shown in FIGS. 22A through 22C, the filters have the wavelength-dependent optical transmittances and reflectances.

Figure 23A:
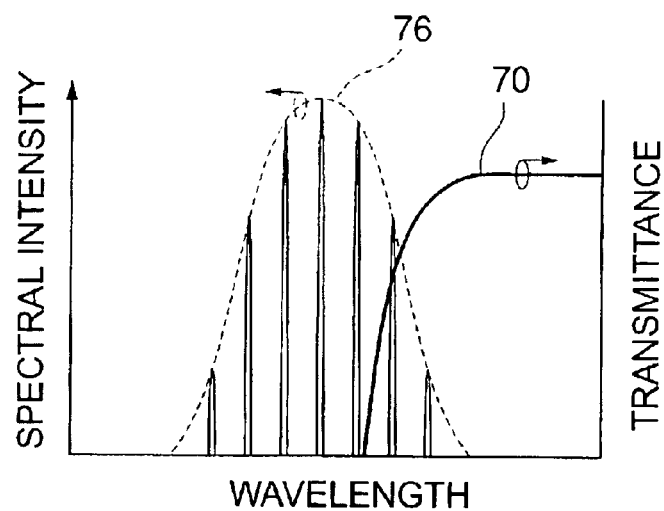
FIGS. 23A–23C illustrate the relationships between the transmission wavelength regions shown in FIGS. 22A–22C and a multimode spectrum.
Figure 23B:
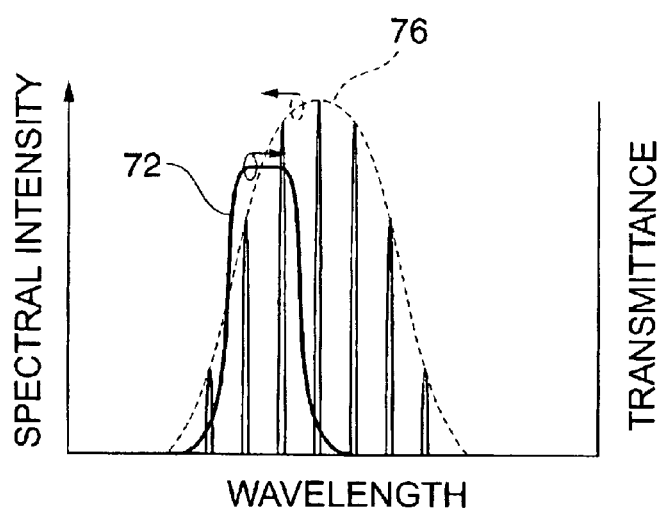
Figure 23C:
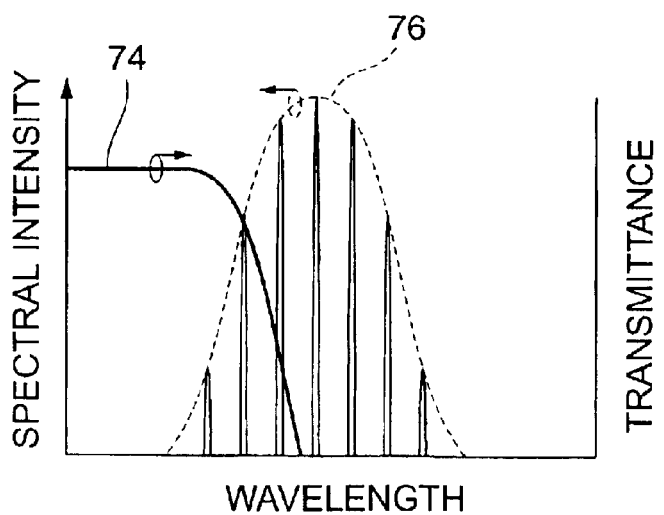

Since the photodetector 33*b* receives light transmitted through the optical filter, the transmission region of the filter influences the output of the photodetector 33*b*. FIGS. 23A through 23C show the respective relationships between the transmission regions 70, 72 and 74 shown in FIGS. 22A through 22C and the multimode spectrum 76 of light produced in the light-emitting device 31. As shown in FIGS. 23A through 23C, all of the transmission regions 70, 72 and 74 overlap with the multimode spectrum 76. The transmission regions 70 and 74 of the long-wavelength pass filter and short-wavelength pass filter are preferably determined so as to include at least one of the modes in the multimode spectrum 76. The transmission region 72 of the band-pass filter is preferably wider than the interval between the modes in the multimode spectrum 76. In any case, the transmission region of the optical filter is wide enough to be able to include at least two of the modes of the multimode light produced by the light-emitting device 31.

Figure 24A:
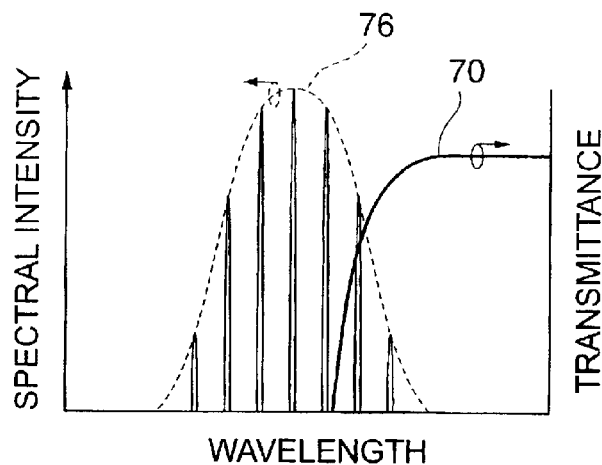
FIG. 24A illustrates the transmission wavelength region of the optical filter and the spectrum of a multimode laser element oscillating at a desired central wavelength.
Figure 24B:
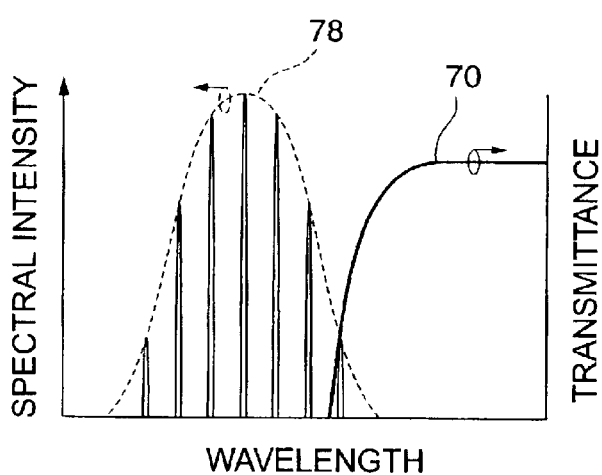
FIG. 24B illustrates the transmission wavelength region of the optical filter and the spectrum of a multimode laser element oscillating at a central wavelength below the desired central wavelength.
Figure 24C:
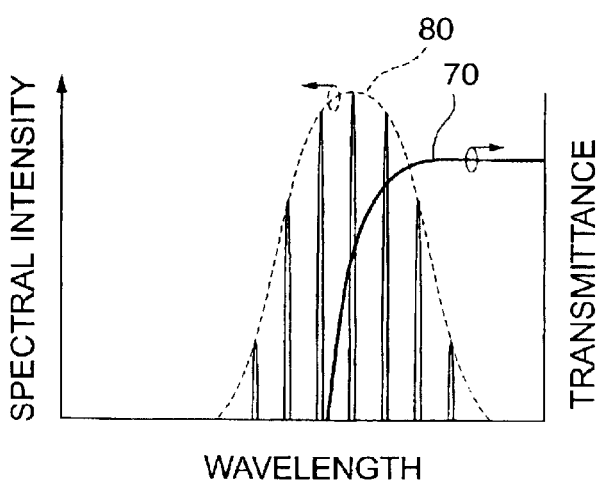
FIG. 24C illustrates the transmission wavelength region of the optical filter and the spectrum of a multimode laser element oscillating at a central wavelength above the desired central wavelength.

FIG. 24A shows the spectrum 76 of the multimode light-emitting device 31 oscillating at a desired central wavelength and the transmission region 70 of the optical filter. FIG. 24B shows the spectrum 78 of the light-emitting device 31 oscillating at a lower central wavelength than the desired central wavelength and the transmission region 70 of the optical filter. FIG. 24C shows the spectrum 80 of the light-emitting device 31 oscillating at a higher central wavelength than the desired central wavelength and the transmission region 70 of the optical filter. In this example, the optical filter is a long-wavelength pass filter.

In FIGS. 24A through 24C, the overlapping areas between the multimode spectra 76, 78 and 80 and the transmission region 70 differ. The difference in the overlapping area is reflected on the output current of the photodetector 33*b*. As the overlapping area increases, the output current also increases. Conversely, as the overlapping area decreases, the output current decreases. Thus, by adjusting the temperature of the light-emitting device 31 based on the output current of the photodetector 33*b*, the oscillation wavelength region of the light-emitting device 31 is regulated to the desired wavelength region and each mode is locked at the desired wavelength. Thus, in this embodiment, the fact that the multimode light-emitting device 31 has a wide oscillation spectrum is noted, and the change in the oscillation wavelength region is detected by measuring the degree to which the oscillation spectrum and the transmission wavelength region of the optical filter overlap.

Advantages similar to those in the first embodiment can also be obtained in this embodiment. That is, the optical filter is surrounded by the roof 35, supporting members 36*a*, 36*b* and the chip carrier 22*b*, which are controlled to substantially equal temperatures. As a result, the temperature change in the optical filter, and therefore the change in the transmission wavelength region of the filter, can be suppressed. Thus the oscillation wavelength region of the light-emitting device 31 can be stabilized more precisely and the variation in the lock wavelength can be suppressed.

Likewise, when an optical filter is used instead of the etalon in the second to seventh embodiments and a multimode semiconductor laser element is used as the light-emitting device 31, the variation in the lock wavelength can be suppressed.

Twelfth Embodiment

In this embodiment, the disposition of the components of the main portion 10 differs from that in the eleventh embodiment. The photodetector 33*b* in this embodiment is disposed to receive light reflected by the optical filter. In other words, the main portion 10 of this embodiment has structure shown in FIGS. 19A, 19B and 20. Apart from this, the twelfth embodiment has the same constitution as the optical module of the eleventh embodiment. The following explanation will focus on the differences from the eleventh embodiment.

Light from the multimode light-emitting device 31 enters the optical filter 64 via the lens 32. The photodetector 33*b* detects components of the output light from the light-emitting device 31 which are reflected by the optical filter 64. Thus the output current of the photodetector 33*b* is affected by the reflection characteristic of the optical filter 64. In other words, the reflection wavelength region of the optical filter 64 influences the output current of the photodetector 33*b*.

The optical filter 64 may be any one of a long-wavelength pass filter, a short-wavelength pass filter or a band-pass filter. The reflection wavelength regions of the optical filters are shown as the broken lines in FIGS. 22A through 22C. The reflection wavelength region of the optical filter 64 overlaps with the multimode spectrum 76 of the light-emitting device 31. The reflection regions of the long-wavelength pass filter and short-wavelength pass filter are preferably determined so as to include at least one of the modes in the multimode spectrum. The reflection region of the band pass filter is preferably wider than the interval between the modes in the multimode spectrum. In any case, the reflection region of the optical filter 64 is wide enough to be able to include at least two of the modes of the multimode light produced by the light-emitting device 31.

The output of the photodetector 33*b* changes in accordance with the degree to which the reflection region of the optical filter 64 and the spectrum of the multimode light from the light-emitting device 31 overlap. By adjusting the temperature of the light-emitting device 31 based on the output current of the photodetector 33*b*, the oscillation wavelength region of the light-emitting device 31 is regulated to the desired wavelength region and each mode is locked at the desired wavelength.

Advantages similar to those in the eleventh embodiment can also be obtained in this embodiment. That is, the optical filter 64 is surrounded by the roof 35, supporting members 36*b*, 36*c* and the chip carrier 22*b*, which are controlled to substantially equal temperatures. As a result, the temperature change in the optical filter 64, and therefore the change in the transmission wavelength region of the filter, can be suppressed. Thus the oscillation wavelength region of the light-emitting device 31 can be stabilized more precisely and the variation in the lock wavelength can be suppressed.

Likewise, when an optical filter is used instead of the etalon in the second to seventh embodiments, photodetector 33b is disposed to receive the light from the laser element 31 reflected by the filter and a multimode semiconductor laser element is used as the light-emitting device 31, the variation in the lock wavelength can be suppressed.

The present invention is not limited to the aforementioned embodiments, and various modifications are possible. In the third embodiment, for example, the aperture members 40 and 41 are disposed to contact the roof 35 and the supporting members 36a, 36b. However, the aperture members 40 and 41 may be disposed apart from the roof 35 and supporting members 36a, 36b. Even in this case, the temperatures of the aperture members 40 and 41 can be regulated to the values substantially equal to the temperature of the cooler 21. Thus the temperatures of the aperture members 40 and 41 become substantially equal to those of the roof 35 and the supporting members 36a, 36b. As a result, substantially the same advantages as the third embodiment are obtained.

It is sufficient if the aperture members 40 and 41 contact at least one of the roof 35, the supporting members 36a and 36b and the chip carrier 22b. The temperatures of the aperture members 40 and 41 will be regulated equal to those of the roof 35, supporting members 36a and 36b and chip carrier 22b by the member which the aperture members 40 and 41 contact. Thus, substantially the same advantages as the third embodiment are obtained. The aperture members 40 and 41 may also contact the etalon or optical filter.

It is preferable that the dimensions of the roof 35, supporting members 36a, 36b, aperture members 40, 41 and fixing member 38 are determined based on the simulation described for the first embodiment in light of the size and material of the etalon or optical filter.

The light-emitting device 31, lens 32, etalon (or optical filter), supporting members 36a, 36b and fixing members 37, 38 may be placed directly on the thermoelectric cooler 21 without using the chip carrier 22b.

The output wavelength region of the semiconductor light-emitting device 31 is not limited to a 1.55 μm band. Also, the value of the lock wavelength is not limited to the ITU grid determined for WDM.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An optical module comprising:
   a semiconductor light-emitting device for emitting light;
   an optical element with wavelength-dependent optical transmittance, said optical element having a light-receiving surface and a light-emitting surface and being disposed to receive said light from said semiconductor light-emitting device on said light-receiving surface;
   a photodetector which is disposed to receive said light transmitted through said optical element;
   a temperature adjuster for heating and/or cooling said optical element, said temperature adjuster being disposed below said optical element; and
   a roof disposed above said optical element and thermally coupled to said temperature adjuster.

2. The optical module according to claim 1, wherein said roof is supported by a supporting member and thermally coupled to said temperature adjuster via said supporting member.

3. The optical module according to claim 2, wherein said supporting member is composed of a material with higher thermal conductivity than that of said optical element.

4. The optical module according to claim 1, further comprising a first aperture member with an opening facing the light-receiving surface of said optical element, said first aperture member being thermally coupled to said temperature adjuster and said roof.

5. The optical module according to claim 4, wherein said first aperture member is composed of a material with higher thermal conductivity than that of said optical element.

6. The optical module according to claim 1, further comprising a second aperture member with an opening facing the light-emitting surface of said optical element, said second aperture member being thermally coupled to said temperature adjuster and said roof.

7. The optical module according to claim 6, wherein said second aperture member is composed of a material with higher thermal conductivity than that of said optical element.

8. The optical module according to claim 1, further comprising a fixing member on which said photodetector is fixed, said fixing member being disposed so that said photodetector faces the light-emitting surface of said optical element and being thermally coupled to said temperature adjuster and said roof.

9. The optical module according to claim 1, further comprising a mounting member for mounting said optical element, said mounting member being thermally coupled to said temperature adjuster and said roof.

10. The optical module according to claim 1, wherein said roof is composed of a material with higher thermal conductivity than that of said optical element.

11. The optical module according to claim 1, wherein said temperature adjuster is a peltier element.

12. The optical module according to claim 1, wherein said optical element is an etalon or an optical filter.

13. The optical module according to claim 1, wherein said semiconductor light-emitting device is a single mode semiconductor laser element, and transmission characteristic of said optical element includes a region in which wavelength and transmittance uniquely correspond.

14. The optical module according to claim 1, wherein said semiconductor light-emitting device is a multimode semiconductor laser element, and said optical element produces transmitted light with a power which changes according to an oscillation wavelength region of said laser element.

15. The optical module according to claim 14, wherein said optical element has a transmission wavelength region able to include two or more modes of said laser element.

16. An optical module comprising:
   a semiconductor light-emitting device for emitting light;
   an optical element with wavelength-dependent optical reflectance, said optical element having a light-receiving surface and being disposed to receive said light from said semiconductor light-emitting device on said light-receiving surface;
   a photodetector disposed to receive said light reflected by said optical element;
   a temperature adjuster for heating and/or cooling said optical element, said temperature adjuster being disposed below said optical element; and
   a roof disposed above said optical element and thermally coupled to said temperature adjuster.

17. The optical module according to claim 16, wherein said roof is supported by a supporting member and thermally coupled to said temperature adjuster via said supporting member.

18. The optical module according to claim 17, wherein said supporting members are composed of a material with higher thermal conductivity than that of said optical element.

19. The optical module according to claim 16, further comprising an aperture member with an opening facing the light-receiving surface of said optical element, said aperture member being thermally coupled to said temperature adjuster and said roof.

20. The optical module according to claim 19, wherein said aperture member is composed of a material with higher thermal conductivity than that of said optical element.

21. The optical module according to claim 16, wherein said semiconductor light-emitting device is a multimode semiconductor laser element, and said optical element produces reflected light with a power which changes according to an oscillation wavelength region of said laser element.

22. The optical module according to claim 21, wherein said optical element has a reflection wavelength region able to include two or more modes of said laser element.

23. The optical module according to claim 16, wherein said temperature adjuster is a peltier element.

24. The optical module according to claim 16, further comprising a fixing member on which said photodetector is fixed, said fixing member being disposed so that said photodetector faces the light-receiving surface of said optical element and being thermally coupled to said temperature adjuster and said roof.

25. The optical module according to claim 16, further comprising a mounting member for mounting said optical element, said mounting member being thermally coupled to said temperature adjuster and said roof.

26. The optical module according to claim 16, wherein said roof is composed of a material with higher thermal conductivity than that of said optical element.

27. The optical module according to claim 16, wherein said optical element is an optical filter.

28. The optical module according to claim 16, wherein said semiconductor light-emitting device is a single mode semiconductor laser element, and reflection characteristic of said optical element includes a region in which wavelength and reflectance uniquely correspond.

\* \* \* \* \*